(12) United States Patent
Lue

(10) Patent No.: US 9,349,745 B2
(45) Date of Patent: May 24, 2016

(54) 3D NAND NONVOLATILE MEMORY WITH STAGGERED VERTICAL GATES

(71) Applicant: Macronix International Co., Ltd., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/555,372

(22) Filed: Nov. 26, 2014

(65) Prior Publication Data

US 2016/0056168 A1     Feb. 25, 2016

Related U.S. Application Data

(60) Provisional application No. 62/041,505, filed on Aug. 25, 2014.

(51) Int. Cl.
*H01L 27/108*     (2006.01)
*H01L 27/115*     (2006.01)
(Continued)

(52) U.S. Cl.
CPC .......... *H01L 27/11582* (2013.01); *G11C 16/08* (2013.01); *G11C 16/26* (2013.01);
(Continued)

(58) Field of Classification Search
CPC ................... H01L 27/10852; H01L 27/11582; H01L 21/28282; H01L 21/76838; H01L 23/528; H01L 27/11565; H01L 27/11568; H01L 27/11573; H01L 29/42352; H01L 29/66833; H01L 29/7926; G11C 16/08; G11C 16/26
See application file for complete search history.

(56) References Cited

U.S. PATENT DOCUMENTS

| 6,906,940 B1 | 6/2005 | Lue |
| 7,315,474 B2 | 1/2008 | Lue |

(Continued)

FOREIGN PATENT DOCUMENTS

EP     2048709 A2     4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Fernando L Toledo
*Assistant Examiner* — Neil Prasad
(74) *Attorney, Agent, or Firm* — Haynes Beffel & Wolfeld LLP

(57) ABSTRACT

A memory device includes a plurality of stacks of conductive strips, a plurality of word lines over and orthogonal to the plurality of stacks of conductive strips, a plurality of vertical gate columns, and control circuitry. The plurality of word lines is electrically coupled to the plurality of vertical gate columns acting as gates controlling current flow in the plurality of stacks of conductive strips. The plurality of word lines including a first word line and a second word line adjacent to each other. The plurality of vertical gate columns is between the plurality of stacks of conductive strips. The plurality of vertical gate columns includes a first set of vertical gate columns electrically coupled to the first word line and a second set of vertical gate columns electrically coupled to the second word line. The first set of vertical gate columns is staggered relative to the second set of vertical gate columns. The control circuitry controls the plurality of word lines as gates to control current flow in the plurality of stacks of conductive strips, and controls nonvolatile memory operations.

22 Claims, 22 Drawing Sheets

(51) Int. Cl.

| | |
|---|---|
| *H01L 29/66* | (2006.01) |
| *H01L 21/28* | (2006.01) |
| *H01L 29/792* | (2006.01) |
| *H01L 29/423* | (2006.01) |
| *H01L 21/768* | (2006.01) |
| *H01L 23/528* | (2006.01) |
| *G11C 16/26* | (2006.01) |
| *G11C 16/08* | (2006.01) |

(52) U.S. Cl.
CPC .... *H01L21/28282* (2013.01); *H01L 21/76838* (2013.01); *H01L 23/528* (2013.01); *H01L 27/11565* (2013.01); *H01L 27/11568* (2013.01); *H01L 27/11573* (2013.01); *H01L 29/42352* (2013.01); *H01L 29/66833* (2013.01); *H01L 29/7926* (2013.01)

(56) References Cited

U.S. PATENT DOCUMENTS

| | | | |
|---|---|---|---|
| 7,420,242 | B2 | 9/2008 | Lung |
| 7,696,559 | B2 | 4/2010 | Arai et al. |
| 7,851,849 | B2 | 12/2010 | Kiyotoshi |
| 8,363,476 | B2 | 1/2013 | Lue et al. |
| 8,467,219 | B2 | 6/2013 | Lue |
| 8,503,213 | B2 | 8/2013 | Chen et al. |
| 8,759,899 | B1 | 6/2014 | Lue et al. |
| 2005/0280061 | A1 | 12/2005 | Lee |
| 2007/0045708 | A1 | 3/2007 | Lung |
| 2007/0252201 | A1 | 11/2007 | Kito et al. |
| 2008/0073635 | A1 | 3/2008 | Kiyotoshi et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0202206 | A1* | 8/2010 | Seol ............... G11C 16/0408 365/185.17 |
| 2010/0270593 | A1 | 10/2010 | Lung et al. |
| 2012/0068241 | A1 | 3/2012 | Sakuma et al. |
| 2012/0119283 | A1 | 5/2012 | Lee et al. |
| 2012/0182806 | A1 | 7/2012 | Chen et al. |
| 2014/0162461 | A1* | 6/2014 | Kim ............... H01L 21/0337 438/703 |
| 2014/0273471 | A1* | 9/2014 | Gwak ............. H01L 21/31144 438/702 |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H., et al., "Bit Cost Scalable Technology with Punch and Plug Process for Ultra High Density Flash Memory," 2007 Symp. VLSI Tech., Digest of Tech. Papers, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

3D NAND NONVOLATILE MEMORY WITH STAGGERED VERTICAL GATES

RELATED APPLICATIONS

This application claims the benefit of U.S. Provisional Patent Application No. 62/041,505, filed on 25 Aug. 2014, which application is incorporated by reference as if fully set forth herein.

BACKGROUND

1. Field of the Invention

The present invention relates to high density memory devices, and particularly to memory devices in which multiple planes of memory cells are arranged to provide a three-dimensional 3D array.

2. Description of Related Art

FIG. 1 is a layout view of part of a 3D vertical gate memory array with vertical gates at regular intervals. The layout view can be further understood in view of subsequent figures. Word lines 2, 4, and 6 run across the top surface of the 3D vertical gate memory array. Word line 2, 4, and 6 are electrically coupled to vertical gate columns (such as vertical gate columns 8, 10, 12, 14, and 16) running into the page. The vertical gate columns electrically that are coupled to the same word line are electrically isolated, by dielectric columns (such as dielectric columns 18, 20, 22, 24, and 26), from the vertical gate columns that are electrically coupled to an adjacent word line.

Conductive strips 28, 30, 32, and 34 are the top strip in a stack of strips that alternate between conductive and dielectric strips. Current flow through the conductive strips 28, 30, 32, and 34 is shown by respective arrows running the length of the conductive strips. In the direction running into the page, each stack of strips alternates between conductive and dielectric strips.

The vertical gate columns apply biases to control current flow in the conductive strips such as conductive strips 28, 30, 32, and 34. The vertical gate columns also control current flow in other conductive strips, not visible in the figure but positioned more deeply in the stacks of strips (more deeply in the direction running into the page).

Charge storage structures, such as charge storage structures 36, 38, 40, 42, 44, 46, 48, and 50, are positioned adjacent to both sides of the stacks of strips. An example of charge storage structures is silicon oxide-silicon nitride-silicon oxide. The charge stored in the proximate part of the charge storage structures alters the bias to be applied by the adjacent vertical gate column in order to cause current flow in the proximate part of the conductive strip.

Each memory device is a double gated device. The gates are on each side of the conductive strip acting as a channel. A charge storage structure is also on each side of the conductive strip acting as a channel, in between the conductive strip in the middle and each gate on each side of the conductive strip.

The vertical gate columns electrically coupled to a first word line are aligned with the vertical gate columns electrically coupled to a second word line adjacent to the first word line. Similarly, the dielectric columns on a first side of a particular word line are aligned with the dielectric columns on a second side of the particular word line; the first side and second side are on opposite sides of the particular word line. Word lines are positioned only over the vertical gate columns, and not positioned over the dielectric columns. The resulting large gaps between the word lines electrically coupled to aligned rows of vertical gate columns represent a design limit to memory density.

It would be desirable to increase the memory density of three-dimensional integrated circuit memory.

SUMMARY

One aspect of the technology is a memory device comprising a plurality of stacks of conductive strips, a plurality of word lines over and orthogonal to the plurality of stacks of conductive strips, a plurality of vertical gate columns between the plurality of stacks of conductive strips, and control circuitry.

The plurality of word lines is electrically coupled to a plurality of vertical gate columns acting as gates controlling current flow in the plurality of stacks of conductive strips. The plurality of word lines including a first word line and a second word line adjacent to each other.

The plurality of vertical gate columns includes a first set of vertical gate columns electrically coupled to the first word line and a second set of vertical gate columns electrically coupled to the second word line. The first set of vertical gate columns is staggered relative to the second set of vertical gate columns. Such staggering results in a honeycomb pattern.

The control circuitry controls the plurality of word lines as gates to control current flow in the plurality of stacks of conductive strips, and controlling nonvolatile memory operations.

In one embodiment of the technology, the first set of vertical gate columns is staggered relative to the second set of vertical gate columns, such that the first set of vertical gate columns is separated by a first set of gate column gaps along the first word line, the second set of vertical gate columns is separated by a second set of gate column gaps along the second word line, the first set of vertical gate columns adjacent to the second set of gate column gaps, and the second set of vertical gate columns adjacent to the first set of gate column gaps.

In one embodiment of the technology, the plurality of vertical gate columns have curved exterior surfaces.

One embodiment of the technology further comprises a plurality of curved charge storage structure layers surrounding the plurality of vertical gate columns. In one embodiment of the technology, adjacent stacks of the plurality of stacks are separated by a volume having a length, and the volume alternates along the length between (i) dielectric fill and (ii) one of the plurality of vertical gate columns surrounded by one of the plurality of curved charge storage structure layers.

One embodiment of the technology further comprises a plurality of flat charge storage structure layers on opposite sides of the plurality of vertical gate columns. In one embodiment of the technology, adjacent stacks of the plurality of stacks are separated by a volume having a length, and the volume alternates along the length between (i) dielectric fill and (ii) one of the plurality of vertical gate columns having flat charge storage structure layers on opposite sides of the plurality of vertical gate columns.

In one embodiment of the technology, the control circuitry performs a read operation by applying a read bias to a selected one of the plurality of word lines, and applying an off bias to another word line of the plurality of word lines adjacent to the selected one of the plurality of word lines. In one embodiment of the technology, the control circuitry performs a read operation by applying a read bias to a selected one of the plurality of word lines, and applying an off bias to two word lines of the plurality of word lines adjacent to the selected one of the plurality of word lines on opposite sides of the selected one of the plurality of word lines.

Another aspect of the technology is a method, comprising:

forming a plurality of stacks of conductive strips separated by a plurality of gaps;

forming a plurality of word lines over and orthogonal to the plurality of stacks of conductive strips, the plurality of word lines electrically coupled to a plurality of vertical gate columns acting as gates controlling current flow in the plurality of stacks of conductive strips, the plurality of word lines including a first word line and a second word line adjacent to each other;

forming the plurality of vertical gate columns between the plurality of stacks of conductive strips, the plurality of vertical gate columns including a first set of vertical gate columns electrically coupled to the first word line and a second set of vertical gate columns electrically coupled to the second word line, the first set of vertical gate columns staggered relative to the second set of vertical gate columns; and forming control circuitry controlling the plurality of word lines as gates to control current flow in the plurality of stacks of conductive strips and to control nonvolatile memory operations.

One embodiment of the technology further comprises:

forming charge storage structure layers and gate material in the plurality of gaps;

etching the gate material to leave the plurality of vertical gate columns separated by a plurality of holes; and forming dielectric in the plurality of holes.

One embodiment of the technology further comprises:

forming dielectric in the plurality of gaps;

etching the dielectric and pluralities of stacks of conductive strips to form cavities centered in the dielectric in between the stacks of conductive strips; and forming the plurality of vertical gate columns in the cavities.

In one embodiment of the technology, the first set of vertical gate columns is staggered relative to the second set of vertical gate columns, such that the first set of vertical gate columns is separated by a first set of gate column gaps along the first word line, the second set of vertical gate columns is separated by a second set of gate column gaps along the second word line, the first set of vertical gate columns adjacent to the second set of gate column gaps, the second set of vertical gate columns adjacent to the first set of gate column gaps.

In one embodiment of the technology, the plurality of vertical gate columns have curved exterior surfaces.

One embodiment of the technology further comprises a plurality of curved charge storage structure layers surrounding the plurality of vertical gate columns. In one embodiment of the technology, adjacent stacks of the plurality of stacks are separated by a volume having a length, and the volume alternates along the length between (i) dielectric fill and (ii) one of the plurality of vertical gate columns surrounded by one of the plurality of curved charge storage structure layers.

One embodiment of the technology further comprises a plurality of flat charge storage structure layers on opposite sides of the plurality of vertical gate columns. In one embodiment of the technology, adjacent stacks of the plurality of stacks are separated by a volume having a length, and the volume alternates along the length between (i) dielectric fill and (ii) one of the plurality of vertical gate columns having flat charge storage structure layers on opposite sides of the plurality of vertical gate columns.

In one embodiment of the technology, the control circuitry performs a read operation by applying a read bias to a selected one of the plurality of word lines, and applying an off bias to another word line of the plurality of word lines adjacent to the selected one of the plurality of word lines. In one embodiment of the technology, the control circuitry performs a read operation by applying a read bias to a selected one of the plurality of word lines, and applying an off bias to two word lines of the plurality of word lines adjacent to the selected one of the plurality of word lines on opposite sides of the selected one of the plurality of word lines.

Other aspects and advantages of the present invention can be seen on review of the drawings, the detailed description and the claims, which follow.

DETAILED DESCRIPTION

A detailed description of embodiments of the present invention is provided with reference to the FIGS. 2-32.

Figure 1:
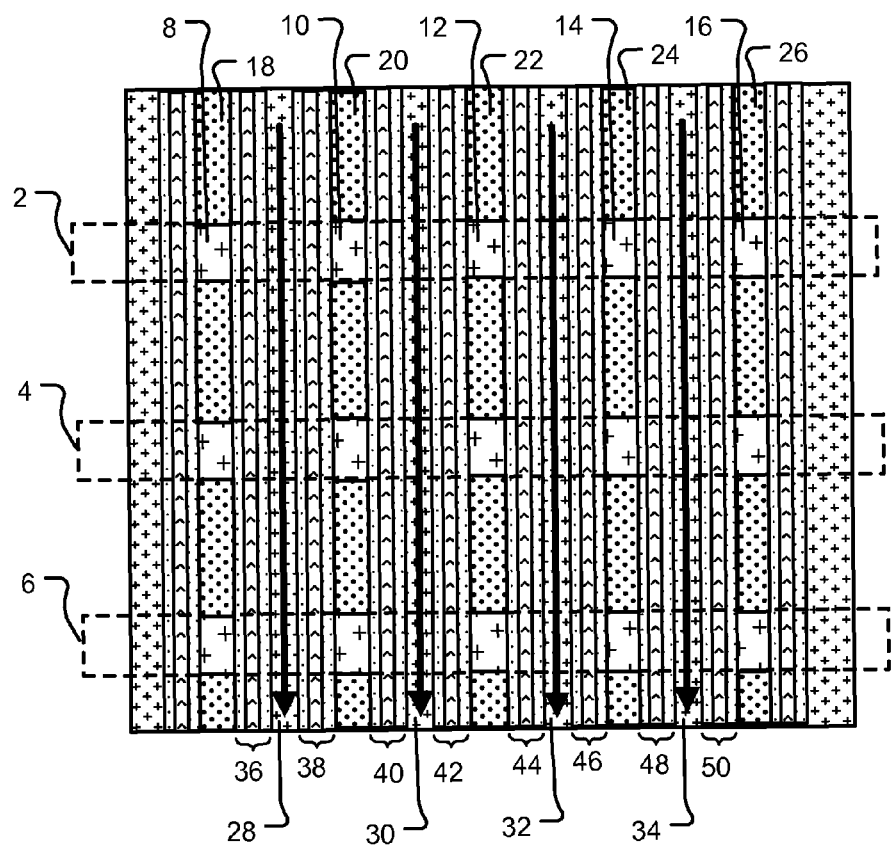
FIG. 1 is a layout view of part of a 3D vertical gate memory array with vertical gates at regular intervals.
Figure 2:
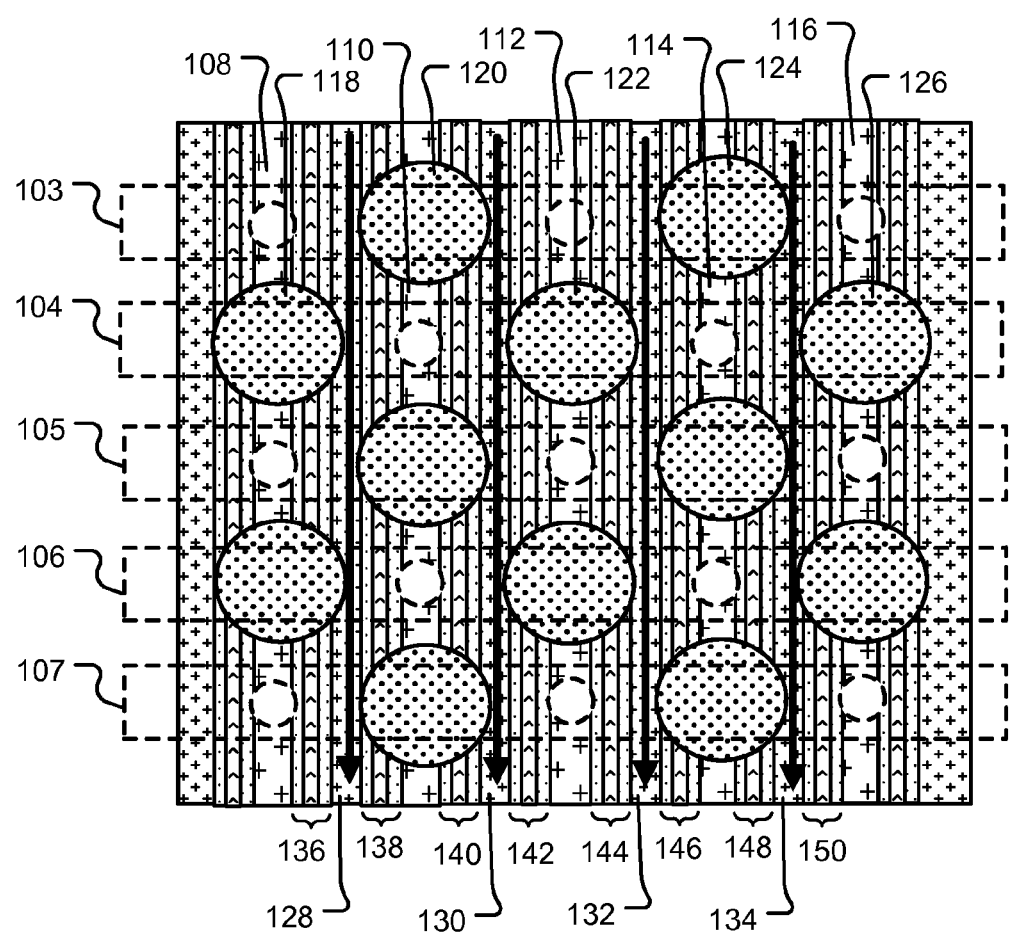
FIG. 2 is a layout view of part of a 3D vertical gate memory array with vertical gates at staggered intervals.

FIG. 2 is a layout view of part of a 3D vertical gate memory array with vertical gates at staggered intervals.

Word lines 103, 104, 105, 106, and 107 run across the top surface of the 3D vertical gate memory array. Word lines 103, 104, 105, 106, and 107 are electrically coupled to vertical gate columns (such as vertical gate columns 108, 110, 112, 114, and 116) running into the page. Example word line materials are metal and polysilicon which can be covered with low-resistance silicide such as cobalt silicide. More generally, the word lines can comprise a variety of materials including doped semiconductors, metals, and conductive compounds like Si, Ge, SiGe, SiC, TiN, TaN, W, and Pt.

Dielectric columns (such as dielectric columns 118, 120, 122, 124, and 126) isolate vertical gate columns electrically coupled to a word line from other vertical gate columns that are electrically coupled to another word line. For example, dielectric columns electrically isolate vertical gate columns electrically coupled to word line 103 from vertical gate columns electrically coupled to word line 105. In another example, dielectric columns electrically isolate vertical gate columns electrically coupled to word line 104 from vertical gate columns electrically coupled to word line 106.

Vertical gate columns electrically coupled to word line 103 are aligned with vertical gate columns electrically coupled to word line 105 and with vertical gate columns electrically coupled to word line 107. Vertical gate columns electrically coupled to word line 104 are aligned with vertical gate columns electrically coupled to word line 106. The vertical gate columns can comprise semiconductor materials adapted to act as channels for the memory cells, including such materials as Si, Ge, SiGE, GaAs, SiC, and graphene.

Vertical gate columns electrically coupled to word lines 103, 105, and 107 are staggered relative to vertical gate columns electrically coupled to word lines 104 and 106. For example, the vertical gate columns coupled to word line 103 are separated by a first set of gaps along word line 103, where the first set of gaps are filled by dielectric columns and conductive strips. The vertical gate columns coupled to word line 104 are separated by a second set of gaps along word line 104, where the second set of gaps are filled by dielectric columns and conductive strips. The vertical gate columns coupled to word line 103 are adjacent to the second set of gaps instead of being adjacent to the vertical gate columns coupled to word line 104. The vertical gate columns coupled to word line 104 are adjacent to the first set of gaps instead of being adjacent to the vertical gate columns coupled to word line 103.

Such staggering of the vertical gate columns results in a honeycomb pattern, which allows a larger memory density. Consecutively adjacent word lines can be labeled as alternating between even word lines and odd word lines. The vertical gate columns electrically coupled to an even word line are aligned with vertical gate columns electrically coupled to other even word lines. The vertical gate columns electrically coupled to an odd word line are aligned with vertical gate columns electrically coupled to other odd word lines. Because the space between two adjacent odd word lines is occupied by an even word line (state another way, because the space between two adjacent even word lines is occupied by an odd word line), memory density is increased.

Conductive strips 128, 130, 132, and 134 are the top strip in a stack of strips that alternate between conductive and dielectric strips. Current flow through the conductive strips 128, 130, 132, and 134 is shown by respective arrows running the length of the conductive strips. In the direction running into the page, each stack of strips alternates between conductive and dielectric strips. Each strip supports a NAND string of nonvolatile memory cells.

The vertical gate columns apply biases to control current flow in the conductive strips such as conductive strips 128, 130, 132, and 134. The vertical gate columns also control current flow in other conductive strips, not visible in the figure but positioned more deeply in the stacks of strips (more deeply in the direction running into the page).

Charge storage structures, such as charge storage structures 136, 138, 140, 142, 144, 146, 148, and 150, are positioned adjacent to both sides of the stacks of strips. An example of charge storage structures is silicon oxide-silicon nitride-silicon oxide. More generally, charge storage structures in the memory device, can comprise multilayer dielectric charge trapping structures known from flash memory technologies, such as SONOS, BE-SONOS, TANOS, and MA BE-SONOS and so on. The charge stored in the proximate part of the charge storage structures alters the bias to be applied by the adjacent vertical gate column in order to cause current flow in the proximate part of the conductive strip. Examples of memory operations are provided elsewhere.

Each memory device is a single gated device. At a particular point along a conductive strip, a vertical gate column acting as a gate is on just one side of the conductive strip, rather than on both sides of the conductive strip. Charge storage is in between the conductive strip in the middle and the gate on one side of the conductive strip.

Any particular vertical gate column acts as a gate to the device on both sides of the gate. In each layer of conductive strips, the same gate controls whether current flows in the portion of the conductive strip on both sides of the gate, such that the same gate controls the device on both sides of the gate. However, a memory operation can select one particular conductive strip on just one side of the gate, such that in a memory operation one memory device is selected.

Figure 3:
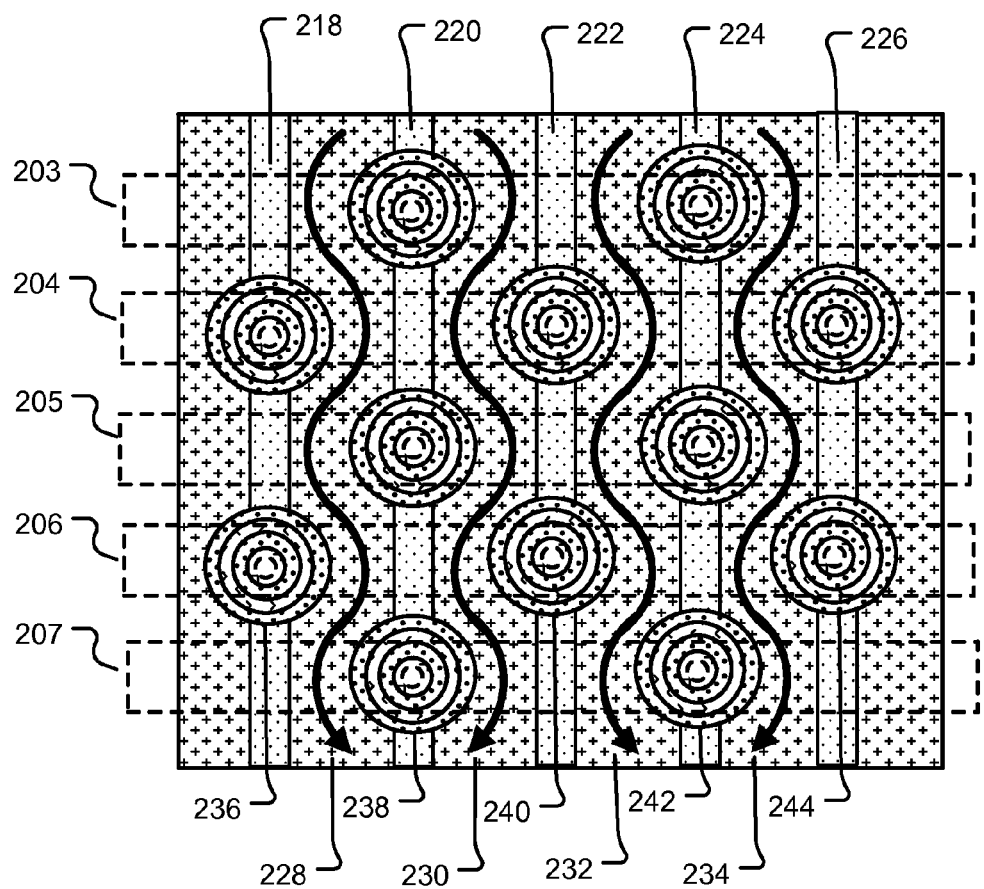
FIG. 3 is a layout view of part of an alternative 3D vertical gate memory array with vertical gates at staggered intervals.

FIG. 3 is a layout view of part of an alternative 3D vertical gate memory array with vertical gates at staggered intervals.

Word lines 203, 204, 205, 206, and 207 run across the top surface of the 3D vertical gate memory array. Word lines 203, 204, 205, 206, and 207 are electrically coupled to vertical gate columns (such as vertical gate columns 238 and 242) running into the page. Example word line materials are metal and polysilicon which can be covered with low-resistance silicide such as cobalt silicide. More generally, the word lines can comprise a variety of materials including doped semiconductors, metals, and conductive compounds like Si, Ge, SiGe, SiC, TiN, TaN, W, and Pt.

Dielectric columns (such as dielectric columns 218, 220, 222, 224, and 226) isolate vertical gate columns electrically coupled to a word line from other vertical gate columns that are electrically coupled to another word line. For example, dielectric columns electrically isolate vertical gate columns electrically coupled to word line 203 from vertical gate columns electrically coupled to word line 205. In another example, dielectric columns electrically isolate vertical gate columns electrically coupled to word line 204 from vertical gate columns electrically coupled to word line 206.

Vertical gate columns electrically coupled to word line 203 are aligned with vertical gate columns electrically coupled to word line 205 and with vertical gate columns electrically coupled to word line 207. Vertical gate columns electrically coupled to word line 204 are aligned with vertical gate columns electrically coupled to word line 206. The vertical gate columns can comprise semiconductor materials adapted to act as channels for the memory cells, including such materials as Si, Ge, SiGE, GaAs, SiC, and graphene.

Vertical gate columns electrically coupled to word lines 203, 205, and 207 are staggered relative to vertical gate columns electrically coupled to word lines 204 and 206. For example, the vertical gate columns coupled to word line 203 are separated by a first set of gaps along word line 203, where the first set of gaps are filled by dielectric columns and conductive strips. The vertical gate columns coupled to word line 204 are separated by a second set of gaps along word line 204, where the second set of gaps are filled by dielectric columns and conductive strips. The vertical gate columns coupled to word line 203 are adjacent to the second set of gaps instead of being adjacent to the vertical gate columns coupled to word line 204. The vertical gate columns coupled to word line 204 are adjacent to the first set of gaps instead of being adjacent to the vertical gate columns coupled to word line 203.

Such staggering of the vertical gate columns results in a honeycomb pattern, which allows a larger memory density. Consecutively adjacent word lines can be labeled as alternating between even word line and odd word lines. The vertical gate columns electrically coupled to an even word line are aligned with vertical gate columns electrically coupled to other even word lines. The vertical gate columns electrically coupled to an odd word line are aligned with vertical gate columns electrically coupled to other odd word lines. Because the space between two adjacent odd word lines is occupied by an even word line (state another way, because the space between two adjacent even word lines is occupied by an odd word line), memory density is increased.

Conductive strips 228, 230, 232, and 234 are the top strip in a stack of strips that alternate between conductive and dielectric strips. Current flow through the conductive strips 228, 230, 232, and 234 is shown by respective arrows running the length of the conductive strips. The arrows are stylistically shown curving back and forth along the conductive strips around vertical gate columns that appear on alternating sides of the conductive strips. In the direction running into the page, each stack of strips alternates between conductive and dielectric strips. Each strip supports a NAND string of nonvolatile memory cells.

Each memory device is a single gated device. At a particular point along a conductive strip, a vertical gate column acting as a gate is on just one side of the conductive strip, rather than on both sides of the conductive strip. A charge storage structure is in between the conductive strip in the middle and the gate on one side of the conductive strip.

Any particular vertical gate column acts as a gate to the device on both sides of the gate. In each layer of conductive strips, the same gate controls whether current flows in the portion of the conductive strip on both sides of the gate, such that the same gate controls the device on both sides of the gate. However, a memory operation can select one particular conductive strip on just one side of the gate, such that in a memory operation one memory device is selected.

The vertical gate columns apply biases to control current flow in the conductive strips such as conductive strips 228, 230, 232, and 234. The vertical gate columns also control current flow in other conductive strips, not visible in the figure but positioned more deeply in the stacks of strips (more deeply in the direction running into the page).

A charge storage structures are wrapped around each vertical gate column, such as vertical gate column 238 and 242. An example of a charge storage structure is silicon oxide-silicon nitride-silicon oxide. More generally, charge storage structures in the memory device, can comprise multilayer dielectric charge trapping structures known from flash memory technologies, such as SONOS, BE-SONOS, TANOS, and MA BE-SONOS and so on. The charge stored in the proximate charge storage structure alters the bias to be applied by the adjacent vertical gate column in order to cause current flow in the proximate part of the conductive strip. Examples of memory operations are discussed below.

In FIGS. 2 and 3, an example diameter range of the dielectric columns 118, 120, 122, 124, and 126; and the vertical gate column 238 and 242 has an example range of 40-50 nm. In other embodiments the dielectric columns and the vertical gate column can have cross-sections that are square, rectangular, circular, and/or other shapes at one or more of the word line layers.

An example pitch of the dielectric columns 118, 120, 122, 124, and 126; and the vertical gate column 238 and 242 has an example range of 80-100 nm, with a half pitch of 40-50 nm. The word line half-pitch has an example range of 20-25 nm. The strip stack pitch has an example range of 80-100 nm, or half-pitch with an example range of 40-50 nm. The word line pitch is than the pitch of the vertical gate columns along a single word line. For example, word line pitch is half the pitch of the vertical gates along a single word line. The low word line pitch is a result of the staggered vertical gate columns. In alternative layouts, the fraction of the word line pitch to the vertical gates along a single word line is, ¼, ⅛, or other inverse of a power of 2. Alternative embodiments have lay-outs with word line pitches that are "nondichotomous" or other fractions that are not an inverse of a power of 2 and yet smaller than 1.

Each $4F^2$ area has two areas of charge storage structure that can store data. So each memory cell occupies $2F^2$. If each memory cell can perform MLC storing 2 data bits, or TLC storing 3 data bits, memory density can exceed 1 Tb with 32 conductive strip layers in a single integrated circuit of area less than 160 mm².

Figure 4:
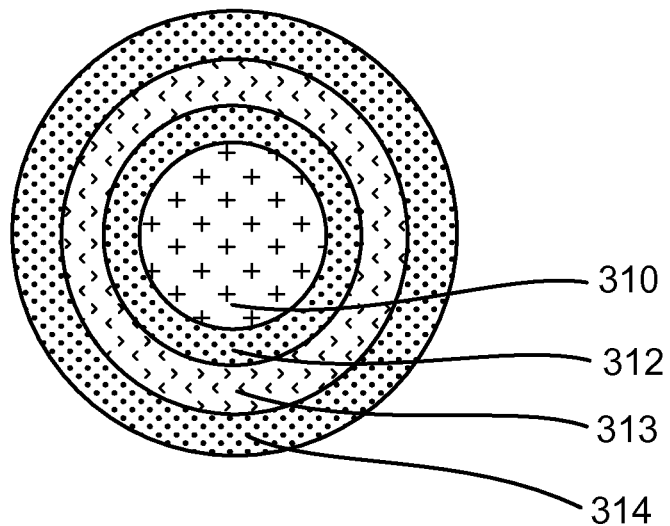
FIGS. 4 and 5 are cross-sections of the vertical gate column of FIG. 3 surrounded by a charge storage structure.
Figure 5:
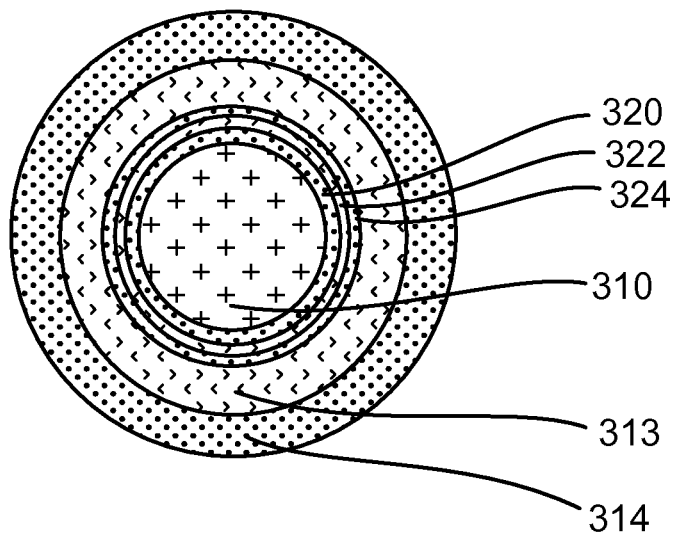

FIGS. 4 and 5 are cross-sections of the vertical gate column of FIG. 3 surrounded by a charge storage structure.

In a representative device of FIG. 4, the charge storage structure can include a bandgap engineered composite tunneling dielectric layer comprising a layer of silicon dioxide 320 less than 2 nm thick, a layer of silicon nitride 322 less than 3 nm thick, and a layer of silicon dioxide 324 less than 4 nm thick. In one embodiment, the composite tunneling dielectric layer consists of an ultrathin silicon oxide layer O1 320 (e.g. <=15 Å), an ultrathin silicon nitride layer N1 322 (e.g. <=30 Å) and an ultrathin silicon oxide layer O2 324 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields. These layers can be conformally deposited using for example LPCVD Other charge trapping materials and structures may be employed, including for example silicon oxynitride ($Si_xO_yN_z$), silicon-rich nitride, silicon-rich oxide, trapping layers including embedded nano-particles and so on.

The dielectric layers can comprises a layer of silicon dioxide and can be formed by LPCVD or other wet conversion from the nitride by a wet furnace oxidation process. Other blocking dielectrics can include high-K materials like aluminum oxide.

The deposition techniques applied to form these layers of BE-SONOS ONO films and channel material can be simply carried out by conventional LPCVD process, which provides excellent film quality and conformality required. On the other hand, tools such as atomic layer deposition ALD tools can be developed for these films.

A tunneling layer of silicon dioxide can be formed for example using in-situ steam generation ISSG with optional nitridation by either a post deposition NO anneal or by addition of NO to the ambient during deposition. Such tunneling layers can be engineered with alternatives such as nitrided oxide for improved endurance, and/or fluorine treatments for improved interface state quality. Other low leakage oxides such as $Al_2O_3$ are possible.

The tunneling layer of silicon nitride, also referred to as a tunneling nitride layer, can be formed for example using low-pressure chemical vapor deposition LPCVD, using for example dichlorosilane DCS and $NH_3$ precursors at 680 degrees C. In alternative processes, the tunneling nitride layer comprises silicon oxynitride, made using a similar process with an $N_2O$ precursor. Because of its thinness, the tunneling layer of silicon nitride is poor at storing charge. The tunneling layer of silicon nitride provides a low hole barrier height to facilitate hole injection for −FN erasing. Various other materials, along with their valence band offsets with silicon are: $SiO_2$ 4.4 eV, $Si_3N_4$ 1.8 eV, $Ta_2O_5$ 3.0 eV, $BaTiO_3$ 2.3 eV, $BaZrO_3$ 3.4 eV, $ZrO_2$ 3.3 eV, $HfO_2$ 3.4 eV, $Al_2O_3$ 4.9 eV, $Y_2O_3$ 3.6 eV, $ZrSiO_4$ 3.4 eV. $Si_3N_4$ has the lowest hole barrier height with 1.8 eV, although other materials are possible.

The charge storage layer comprises silicon nitride formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006. High charge trapping efficiency alternatives are oxynitride, silicon-rich nitride, embedded nanoparticles, and HfO2.

In contrast with FIG. 5, FIG. 4 shows a noncomposite tunneling dielectric layer comprising a layer of silicon dioxide 312 similar to the blocking dielectric layer in the layer 314, except thinner.

Figure 6:
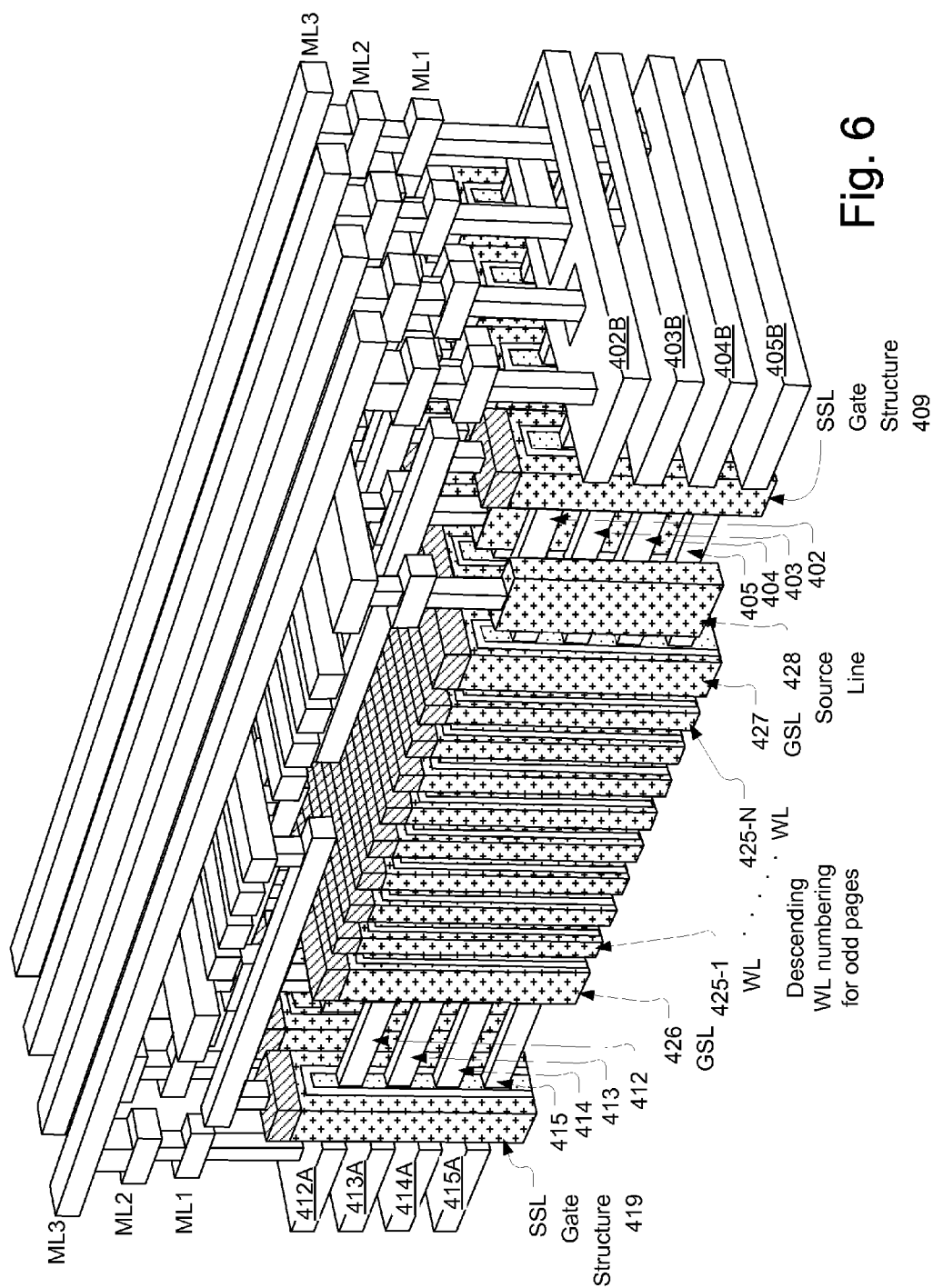
FIG. 6 is a perspective of an implementation of a 3D vertical gate memory array with vertical gates at staggered intervals.

FIG. 6 is a perspective of an implementation of a 3D vertical gate memory array with vertical gates at staggered intervals.

Insulating material is removed from the drawing to expose additional structure. For example, insulating layers are removed between the conductive strips, in the ridge-shaped stacks, and are removed between the ridge-shaped stacks of conductive strips.

The multilayer array is formed on an insulating layer, and includes a plurality of word lines 425-1, . . . , 425-n−1, 425-n conformal with the plurality of ridge-shaped stacks, and which act as word lines WLn, WLn−1, . . . WL1. The plurality of ridge-shaped stacks includes conductive strips 412, 413, 414, 415. Conductive strips in the same plane are electrically coupled together by stairstep structures.

The shown word line numbering, ascending from 1 to N going from the back to the front of the overall structure, applies to even memory pages. For odd memory pages, the word line numbering descends from N to 1 going from the back to the front of the overall structure.

Stairstep structures 412A, 413A, 414A, 415A terminate conductive strips, such as conductive strips 412, 413, 414, 415. As illustrated, these stairstep structures 412A, 413A, 414A, 415A are electrically connected to different bit lines for connection to decoding circuitry to select planes within the array. These stairstep structures 412A, 413A, 414A, 415A can be patterned at the same time that the plurality of ridge-shaped stacks are defined.

Stairstep structures 402B, 403B, 404B, 405B terminate conductive strips, such as conductive strips 402, 403, 404, 405. As illustrated, these stairstep structures 402B, 403B, 404B, 405B are electrically connected to different bit lines for connection to decoding circuitry to select planes within the array. These stairstep structures 402B, 403B, 404B, 405B can be patterned at the same time that the plurality of ridge-shaped stacks are defined.

Any given stack of conductive strips is coupled to either the stairstep structures 412A, 413A, 414A, 415A, or the stairstep structures 402B, 403B, 404B, 405B, but not both. A stack of conductive strips has one of the two opposite orientations of bit line end-to-source line end orientation, or source line end-to-bit line end orientation. For example, the stack of conductive strips 412, 413, 414, 415 has bit line end-to-source line end orientation; and the stack of conductive strips 402, 403, 404, 405 has source line end-to-bit line end orientation.

The stack of conductive strips 412, 413, 414, 415 is terminated at one end by the stairstep structures 412A, 413A, 414A, 415A, passes through SSL gate structure 419, gate select line GSL 426, word lines 425-1 WL through 425-N WL, gate select line GSL 427, and terminated at the other end by source line 428. The stack of conductive strips 412, 413, 414, 415 does not reach the stairstep structures 402B, 403B, 404B, 405B.

The stack of conductive strips 402, 403, 404, 405 is terminated at one end by the stairstep structures 402B, 403B, 404B, 405B, passes through SSL gate structure 409, gate select line GSL 427, word lines 425-N WL through 425-1 WL, gate select line GSL 426, and terminated at the other end by a source line (obscured by other parts of figure). The stack of conductive strips 402, 403, 404, 405 does not reach the stairstep structures 412A, 413A, 414A, 415A.

A layer of memory material separates the word lines 425-1 through 425-n, from the conductive strips 412-415 and 402-405 as described in detail in prior figures. Ground select lines GSL 426 and GSL 427 are conformal with the plurality of ridge-shaped stacks, similar to the word lines.

Every stack of conductive strips is terminated at one end by stairstep structures, and at the other end by a source line. For example, the stack of conductive strips 412, 413, 414, 415 is terminated at one end by stairstep structures 412A, 413A, 414A, 415A, and terminated on the other end by source line 428. At the near end of the figure, every other stack of conductive strips is terminated by the stairstep structures 402B, 403B, 404B, 405B; and every other stack of conductive strips is terminated by a separate source line. At the far end of the figure, every other stack of conductive strips is terminated by the stairstep structures 412A, 413A, 414A, 415A; and every other stack of conductive strips is terminated by a separate source line. Alternatively, every stack of conductive strips in the same block can terminate at one end by the same stairstep structure, and terminate at the other end with the same source line.

Bit lines and string select lines are formed at the metals layers ML1, ML2, and ML3.

Transistors are formed between the stairstep structures 412A, 413A, 414A and the word line 425-1. In the transistors, the conductive strip (e.g. 413) acts as the channel region of the device. SSL gate structures (e.g. 419, 409) are patterned during the same step that the word lines 425-1 through 425-n are defined. A layer of silicide 426 can be formed along the top surface of the word lines, the ground select lines, and over the gate structures 429. The layer of memory material 415 can act as the gate dielectric for the transistors. These transistors act as string select gates coupled to decoding circuitry for selecting particular ridge-shaped stacks in the array.

FIGS. 7-18 show a process flow of making the 3D vertical gate memory array with vertical gates at staggered intervals, of FIG. 2.

Figures 7, 8:
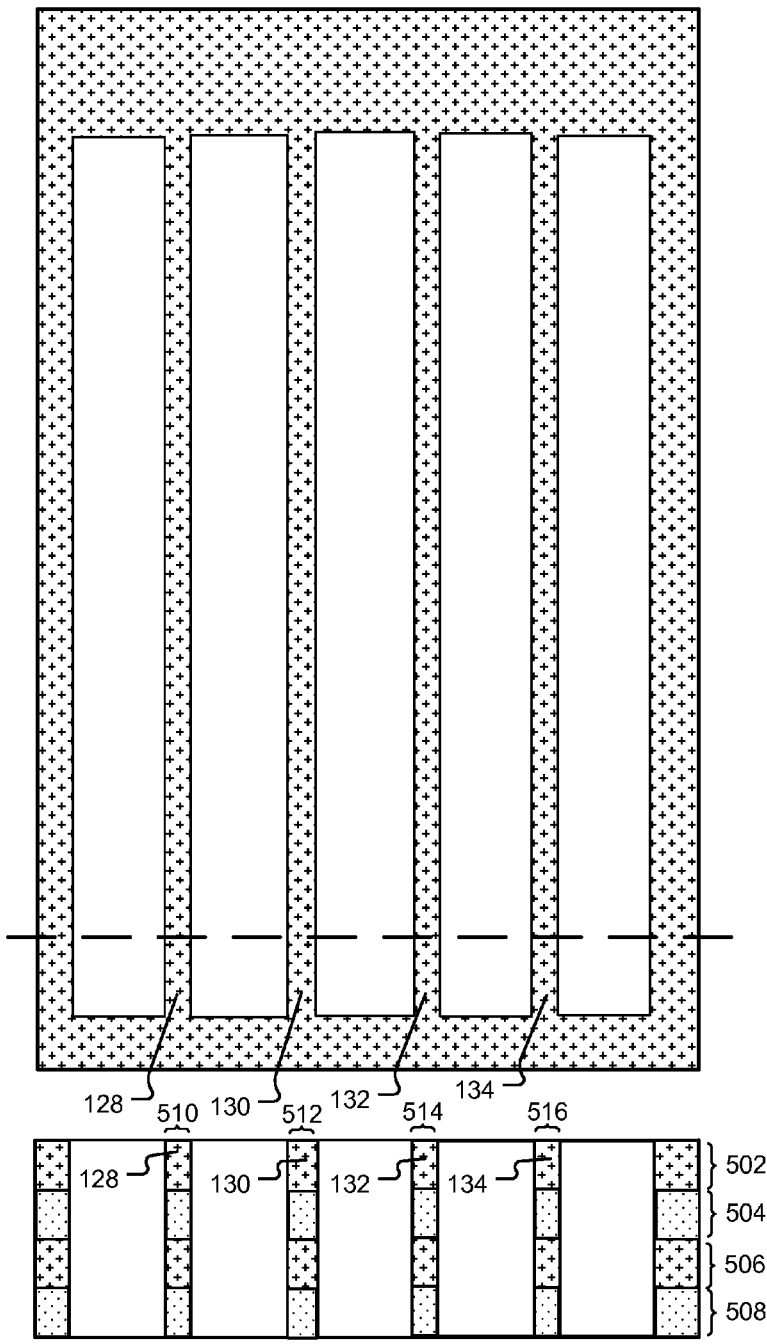
FIGS. 7-18 show a process flow of making the 3D vertical gate memory array with vertical gates at staggered intervals, of FIG. 2.

FIGS. 7 and 8 are respectively top and cross-section views of a step in the process flow of making the 3D vertical gate memory array with vertical gates at staggered intervals. In the top view of FIG. 7, cavities are etched in a stack of layers that alternate between conductive and dielectric layers. FIG. 8 shows a cross-section view taken along the dashed line in FIG. 7.

The etching process can be conducted using a hard mask process. For example, the pattern can be created using a photoresist and photo exposure using immersion 193 nm lithography tools, over a dielectric film overlying the carbon hard mask film. The photoresist pattern is then transferred onto the dielectric film by etching. The dielectric film will serve as the hard mask for opening the sacrificial carbon hard mask, and the sacrificial carbon hard mask will be used to open the holes in the layers.

The etching can be done using a plasma etch recipe, for example by using the combination of NF3, CH2F2, HBr, O2, CH4, and He.

The etch leaves multiple stacks of strips 510, 512, 514, and 516 that alternate between conductive and dielectric strips (in the direction running into the page). The multiple stacks of strips 510, 512, 514, and 516 have strip layers including top conductive strip layer 502, dielectric strip layer 504, conductive strip layer 506, and bottom dielectric strip layer 508. Because the top layer of strips 510, 512, 514, and 516 is top conductive strip layer 502, the top view of FIG. 7 shows conductive material throughout.

Figure 9:
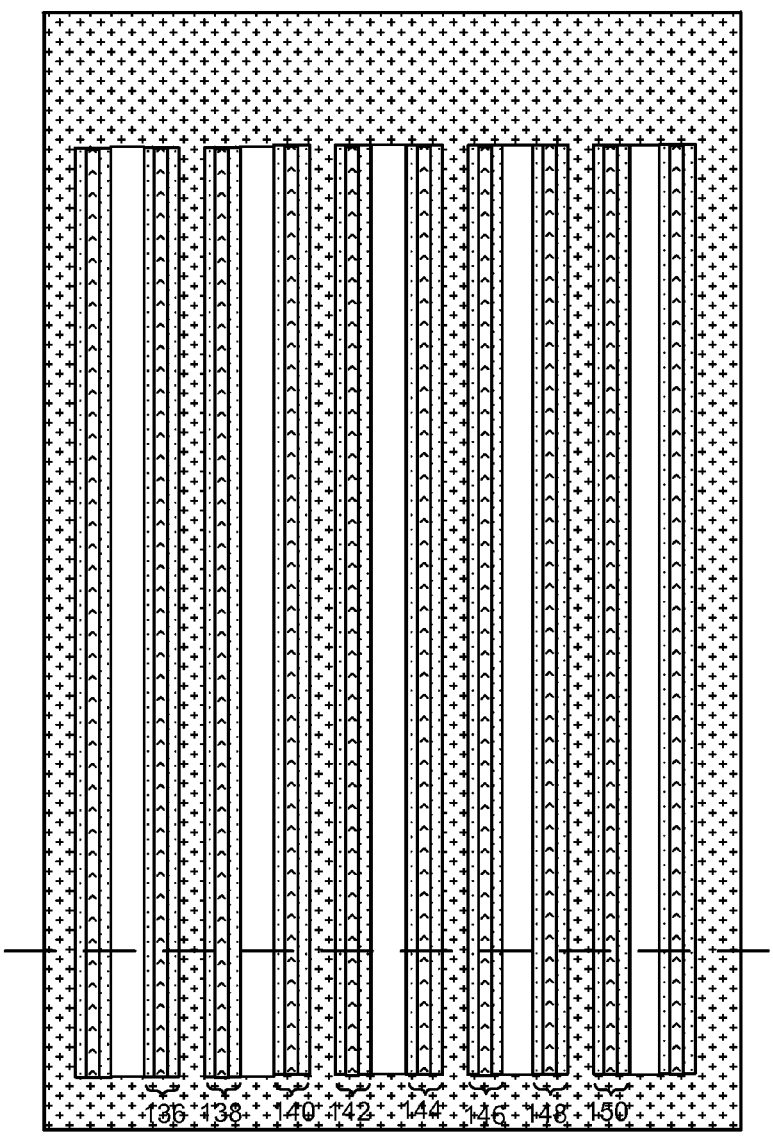
Figure 10:
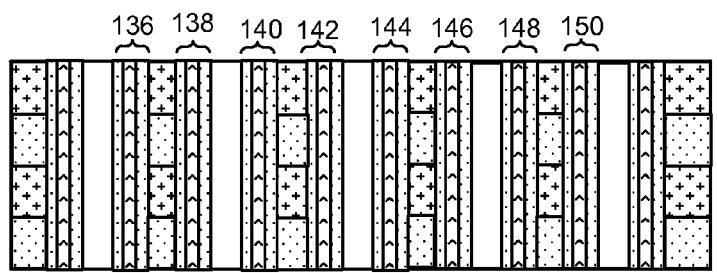

FIGS. 9 and 10 are respectively top and cross-section views of a step in the process flow of making the 3D vertical gate memory array with vertical gates at staggered intervals. In the top view of FIG. 9, the cavities etched in FIGS. 7 and 8 are partly filled with a charge storage structure. FIG. 10 shows a cross-section view taken along the dashed line in FIG. 9. The opposite sides of each cavity are filled with a charge storage structure such as oxide-nitride-oxide (ONO) or oxide-nitride-oxide-nitride-oxide (ONONO).

In FIG. 9, charge storage structures 136, 138, 140, 142, 144, 146, 148, and 150 run along the length of the cavities, on both sides of the cavities. Similarly, in FIG. 10, charge storage structures 136, 138, 140, 142, 144, 146, 148, and 150 has a depth dimension that runs from the top layer strips of the multiple stacks of strips, to the bottom layer strips of the multiple stacks of strips. The charge storage structure adjacent to respective conductive strips in the multiple stacks of strips stores charge which alters the bias to be applied in order to cause current flow in the proximate part of the conductive strip. The adjacent vertical gate column which applies the bias is formed in a subsequent step.

Figure 11:
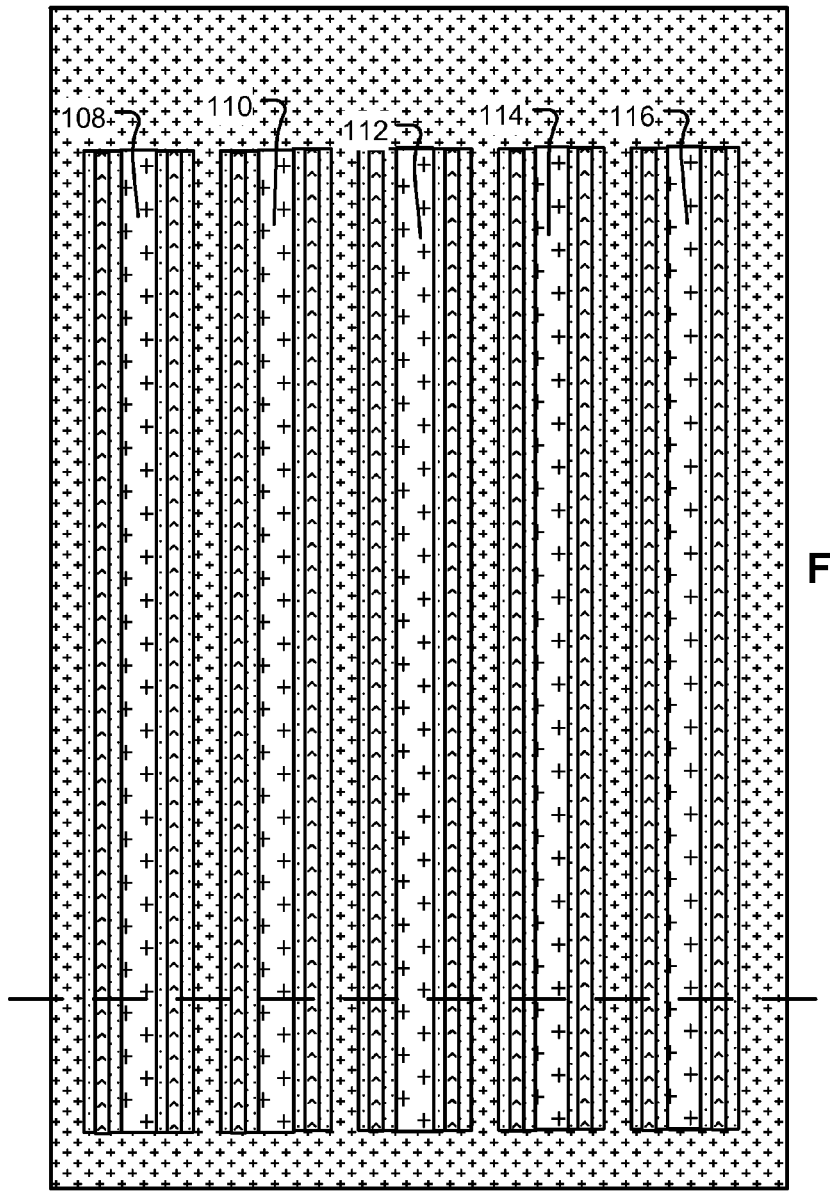
Figure 12:
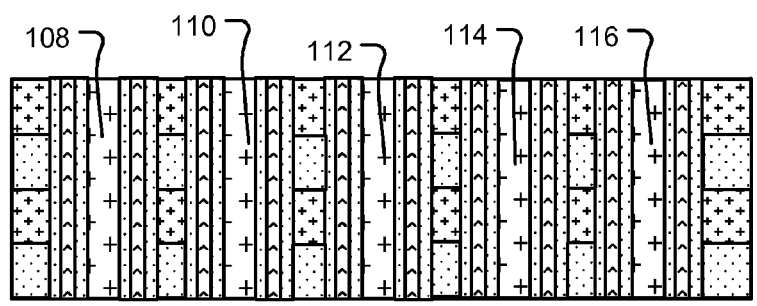

FIGS. 11 and 12 are respectively top and cross-section views of a step in the process flow of making the 3D vertical gate memory array with vertical gates at staggered intervals. In the top view of FIG. 11, the cavities etched in FIGS. 7 and 8, and partly filled with charge storage structures in FIGS. 9 and 10, are filled with vertical gate material 108, 110, 12, 114, and 116.

In one embodiment, the vertical gate material is the same material as the material in the conductive strips of the multiple strip stacks. In other embodiments, although the vertical gate material is a conductive material described as suitable for the conductive strips of the multiple strip stacks, the vertical gate material is different from the conductive material in the conductive strips of the multiple strip stacks. In further embodiments, the vertical gate material can be a metal.

FIG. 12 shows a cross-section view taken along the dashed line in FIG. 11. The unfilled remainder of each cavity formed in FIGS. 7 and 8 is filled with vertical gate material 108, 110, 12, 114, and 116.

In FIG. 11, vertical gate material 108, 110, 12, 114, and 116 runs along the middles of the cavities formed in FIG. 7. Similarly, in FIG. 12, charge storage structures 136, 138, 140, 142, 144, 146, 148, and 150 has a depth dimension that runs from the top layer strips of the multiple stacks of strips, to the bottom layer strips of the multiple stacks of strips. The adjacent vertical gate material applies bias which may cause current flow in the proximate part of the conductive strip, depending on the charge stored in the intervening charge storage structure. The vertical gate material is separated into multiple vertical gate columns in a subsequent step.

Figure 13:
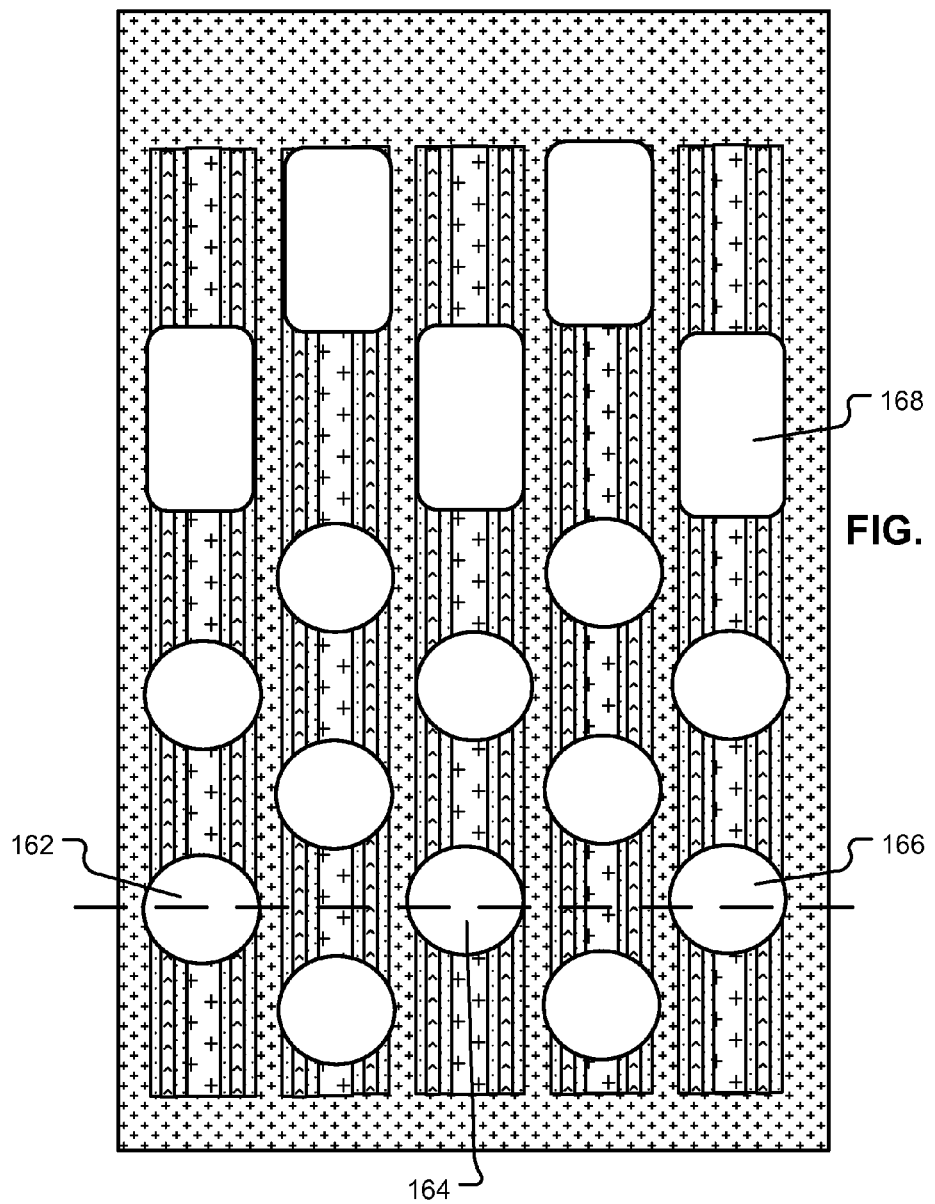
Figure 14:
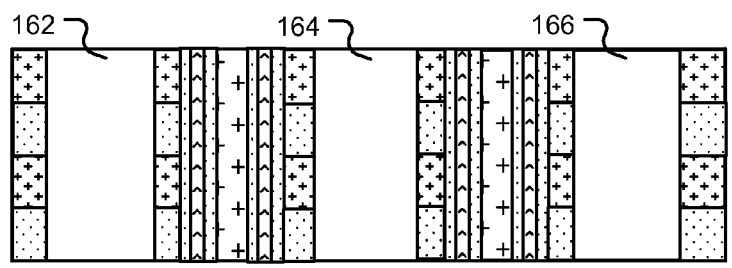

FIGS. 13 and 14 are respectively top and cross-section views of a step in the process flow of making the 3D vertical gate memory array with vertical gates at staggered intervals. In the top view of FIG. 13, the vertical gate material formed in FIGS. 11 and 12 is etched away selectively into multiple vertical gate columns. In FIGS. 13 and 14, the charge storage structure adjacent to the etched vertical gate material is also etched. However, in other embodiments, the charge storage structure adjacent to the etched vertical gate material remains unetched; the multiple vertical gate columns are electrically decoupled from each other. FIG. 14 shows a cross-section view taken along the dashed line in FIG. 13.

In FIG. 13, etched cavities such as cavities 162, 164, 166, and 168 are centered about the vertical gate material. Consecutively adjacent strips of vertical gate material can be labeled as alternating between even vertical gate material strips and odd vertical gate material strips. Horizontal rows of cavities alternate between a row of cavities centered about even vertical gate material strips, and a row of cavities centered about odd vertical gate material strips. As a result, the cavities in neighboring rows of cavities are staggered relative to each other. The cavities in different rows of cavities centered about even vertical gate material strips are aligned with each other, and the cavities in different rows of cavities centered about odd vertical gate material strips are aligned with each other.

In FIG. 14, etched cavities such as cavities 162, 164, and 166 have a depth dimension that runs from the top layer strips of the multiple stacks of strips, to the bottom layer strips of the multiple stacks of strips. Cavities are formed by etching away every other vertical gate material strip.

Figure 15:
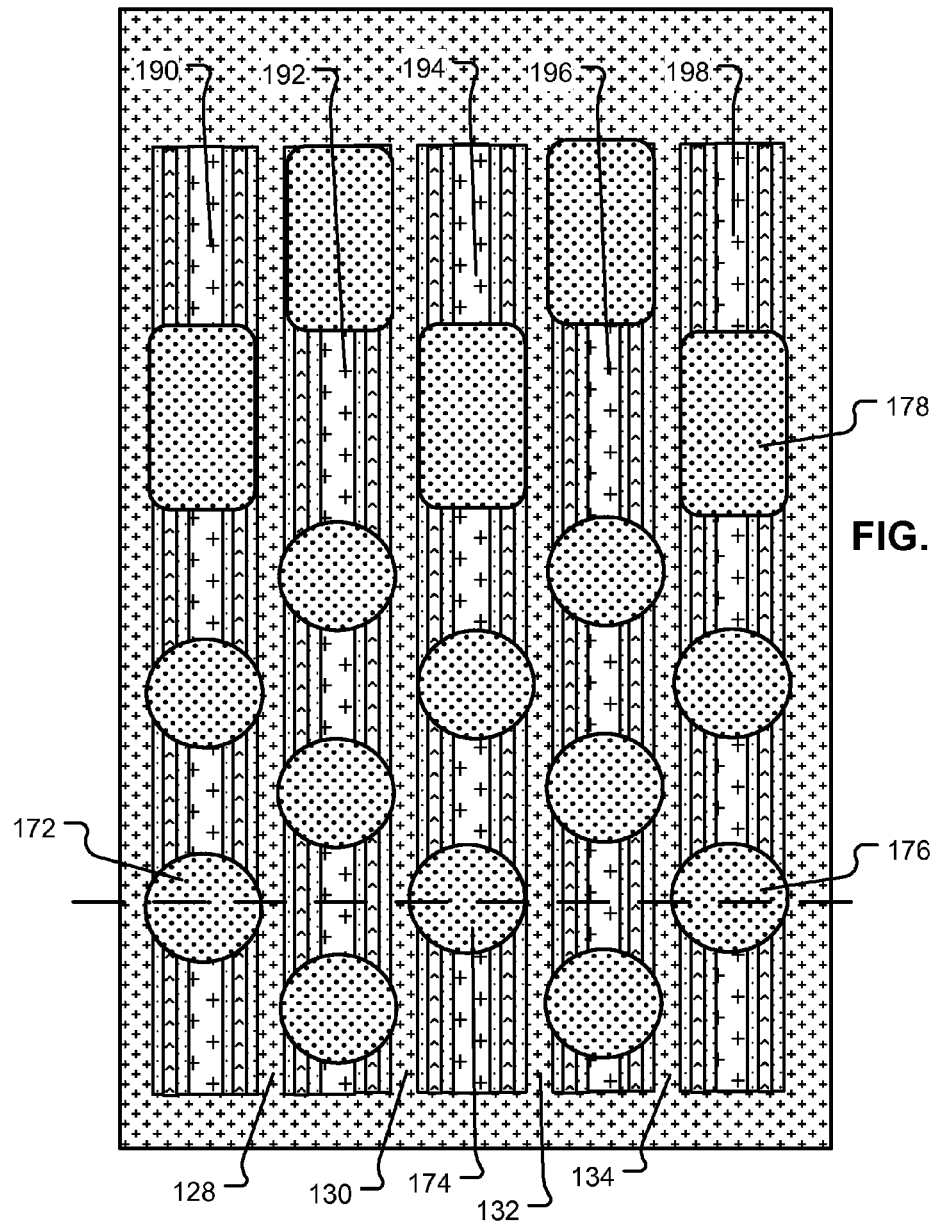
Figure 16:
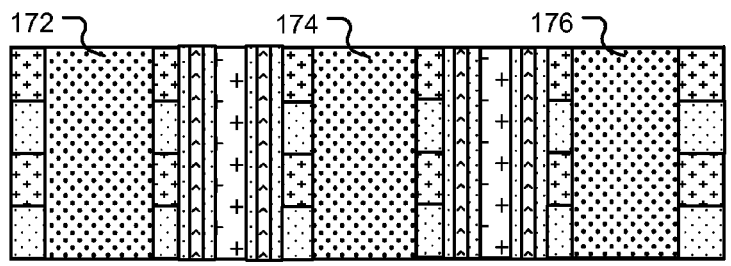

FIGS. 15 and 16 are respectively top and cross-section views of a step in the process flow of making the 3D vertical gate memory array with vertical gates at staggered intervals. In the top view of FIG. 15, the cavities etched in FIGS. 13 and 14 are filled with dielectric material such as dielectric columns 172, 174, 176, and 178.

In one embodiment, the dielectric material is the same material as the material in the dielectric strips of the multiple strip stacks. In other embodiments, although the dielectric material is an insulating material described as suitable for the dielectric strips of the multiple strip stacks, the dielectric material formed in FIGS. 15 and 16 is different from the dielectric material in the insulating strips of the multiple strip stacks.

In FIG. 15, dielectric material fills the cavities formed in FIGS. 13 and 14. FIG. 16 shows a cross-section view taken along the dashed line in FIG. 15. Similarly, in FIG. 16, dielectric columns 172, 174, and 176 have a depth dimension that runs from the top layer strips of the multiple stacks of strips, to the bottom layer strips of the multiple stacks of strips. The dielectric columns electrically isolate adjacent vertical gate columns—that had formerly been a single contiguous strip of vertical gate material—from each other. The dielectric columns are staggered relative to each other in the same manner as described for the etched cavities in FIGS. 13 and 14.

The vertical gate columns 190, 192, 194, 196, and 198 are gates for string select devices. The remaining vertical gate columns are gates for nonvolatile memory devices.

Figure 17:
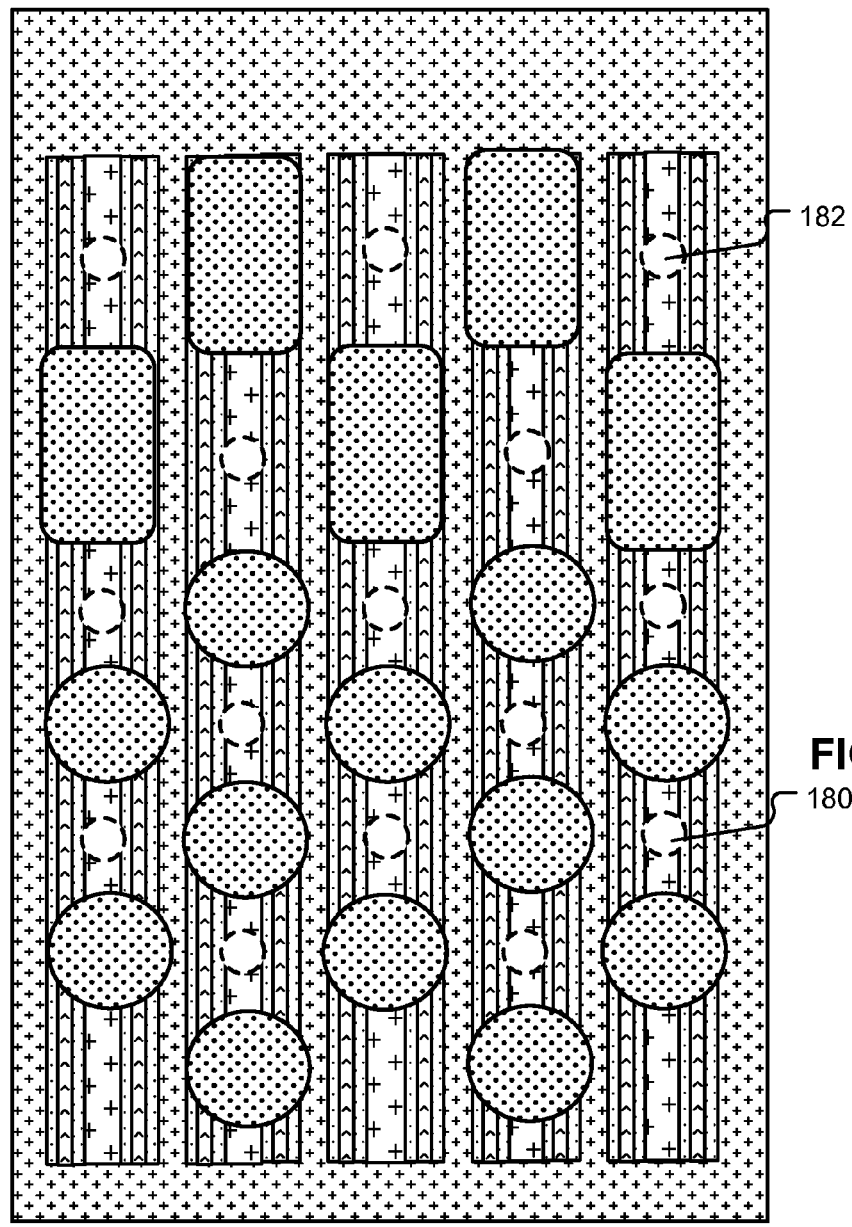

FIG. 17 is a top view of a step in the process flow of making the 3D vertical gate memory array with vertical gates at staggered intervals. In the top view of FIG. 17, conductive plugs such as conductive plugs 180 and 182 are formed to assist electrical coupling between the formed vertical gate columns and the subsequently formed word lines and string select lines.

Figure 18:
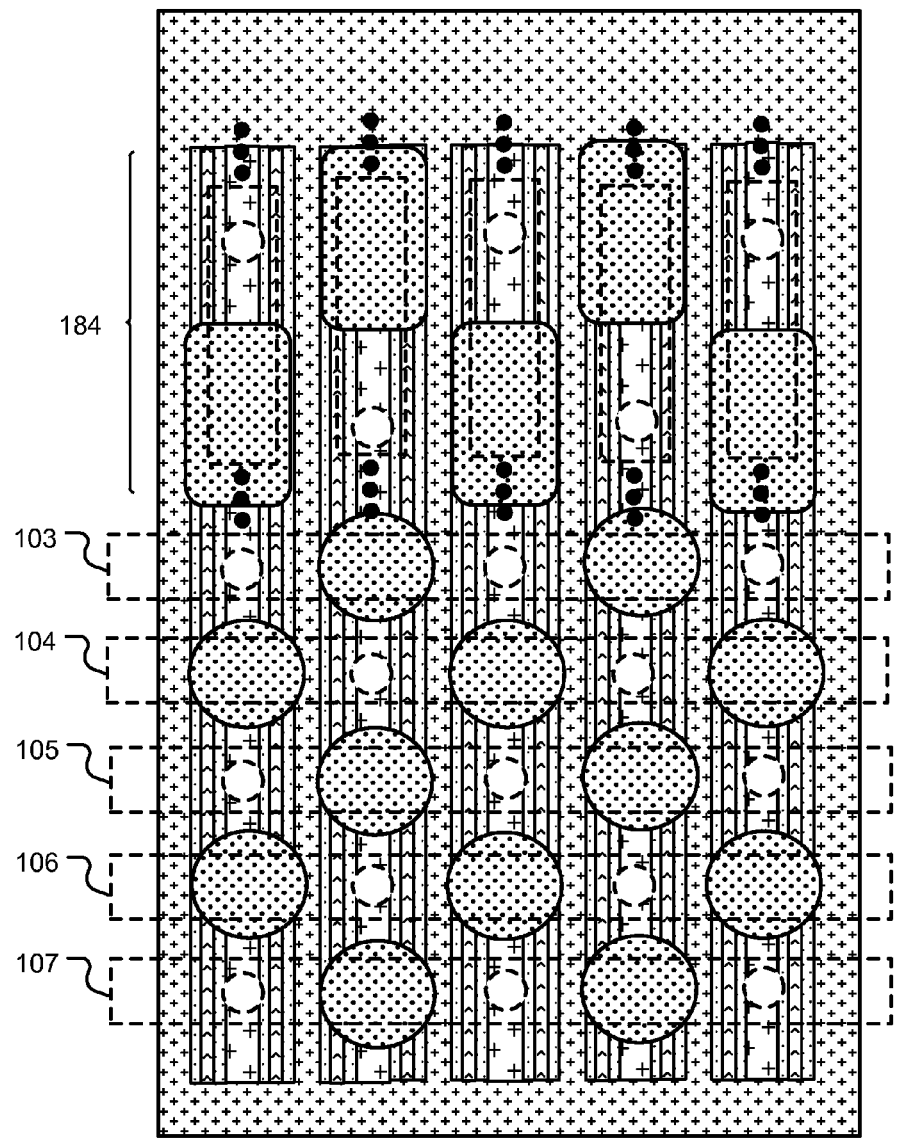

FIG. 18 is a top view of a step in the process flow of making the 3D vertical gate memory array with vertical gates at staggered intervals. In the top view of FIG. 18, word lines 103, 104, 105, 106, and 107 are formed to electrically couple to conductive plugs formed in FIG. 17, such that the word lines 103, 104, 105, 106, and 107 are electrically coupled to the vertical gate columns of nonvolatile memory cells.

String select lines 184 are formed to electrically couple to conductive plugs formed in FIG. 17, such that the string select lines 184 are electrically coupled to the vertical gate columns of string select transistors that select one or more of the multiple stacks of strips.

The string select lines 184 and the word lines 103, 104, 105, 106, and 107 are positioned at different metal levels and have perpendicular orientations. In other embodiments, the string select lines 184 and the word lines 103, 104, 105, 106, and 107 are positioned at the same metal level and/or have parallel orientations.

FIGS. 19-28 show a process flow of making the 3D vertical gate memory array with vertical gates at staggered intervals, of FIG. 3.

Figure 19:
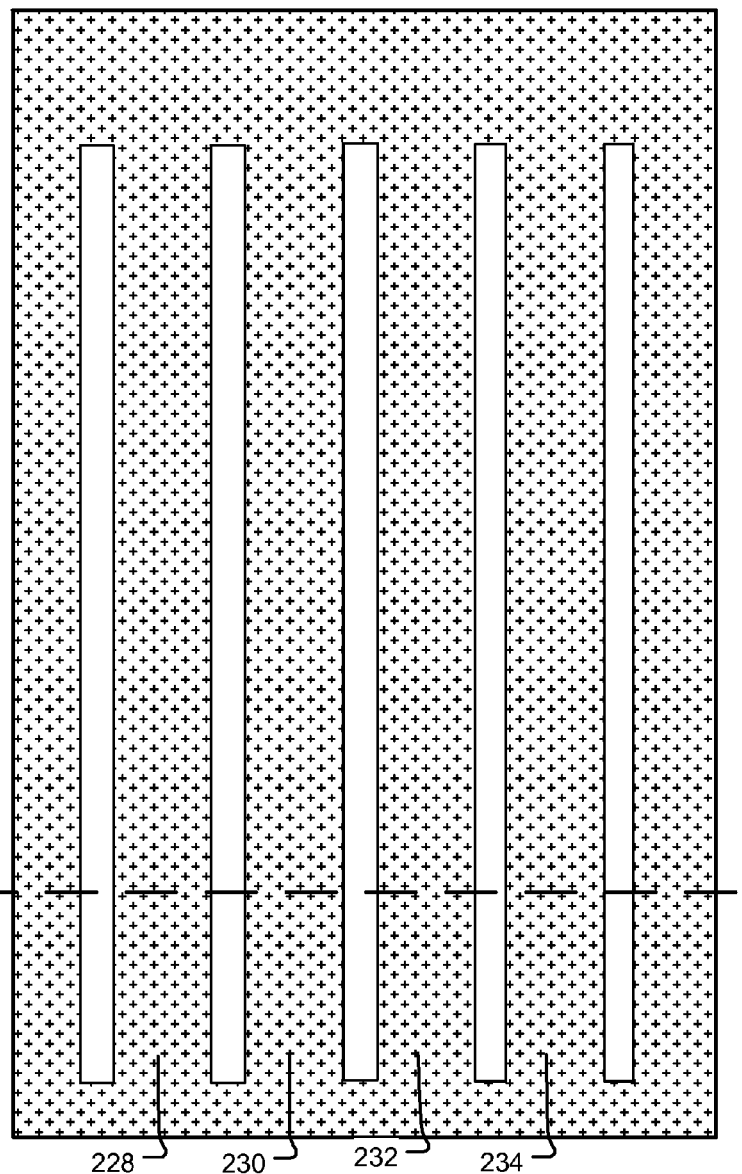
FIGS. 19-28 show a process flow of making the 3D vertical gate memory array with vertical gates at staggered intervals, of FIG. 3.
Figure 20:
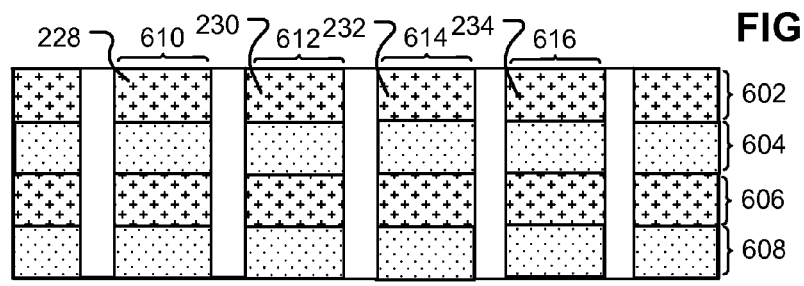

FIGS. 19 and 20 are respectively top and cross-section views of a step in the process flow of making the 3D vertical gate memory array with vertical gates at staggered intervals. In the top view of FIG. 19, cavities are etched in a stack of layers that alternate between conductive and dielectric layers. FIG. 20 shows a cross-section view taken along the dashed line in FIG. 19.

The etching process can be conducted using a hard mask process. For example, the pattern can be created using a photoresist and photo exposure using immersion 193 nm lithography tools, over a dielectric film overlying the carbon hard mask film. The photoresist pattern is then transferred onto the dielectric film by etching. The dielectric film will serve as the hard mask for opening the sacrificial carbon hard mask, and the sacrificial carbon hard mask will be used to open the holes in the layers.

The etching can be done using a plasma etch recipe, for example by using the combination of NF3, CH2F2, HBr, O2, CH4, and He.

The etch leaves multiple stacks of strips 610, 612, 614, and 616 that alternate between conductive and dielectric strips (in the direction running into the page). The multiple stacks of strips 610, 612, 614, and 616 have strip layers including top conductive strip layer 602, dielectric strip layer 604, conductive strip layer 606, and bottom dielectric strip layer 608. Because the top layer of strips 610, 612, 614, and 616 is top conductive strip layer 602, the top view of FIG. 19 shows conductive material throughout.

The etch in FIGS. 19 and 20 can be, though is not required to be, narrower than the etch in FIGS. 7 and 8. The etch in FIGS. 7 and 8 forms cavities that accommodate charge storage structures, whereas the etch in FIGS. 19 and 20 forms cavities that do not accommodate charge storage structures.

Figure 21:
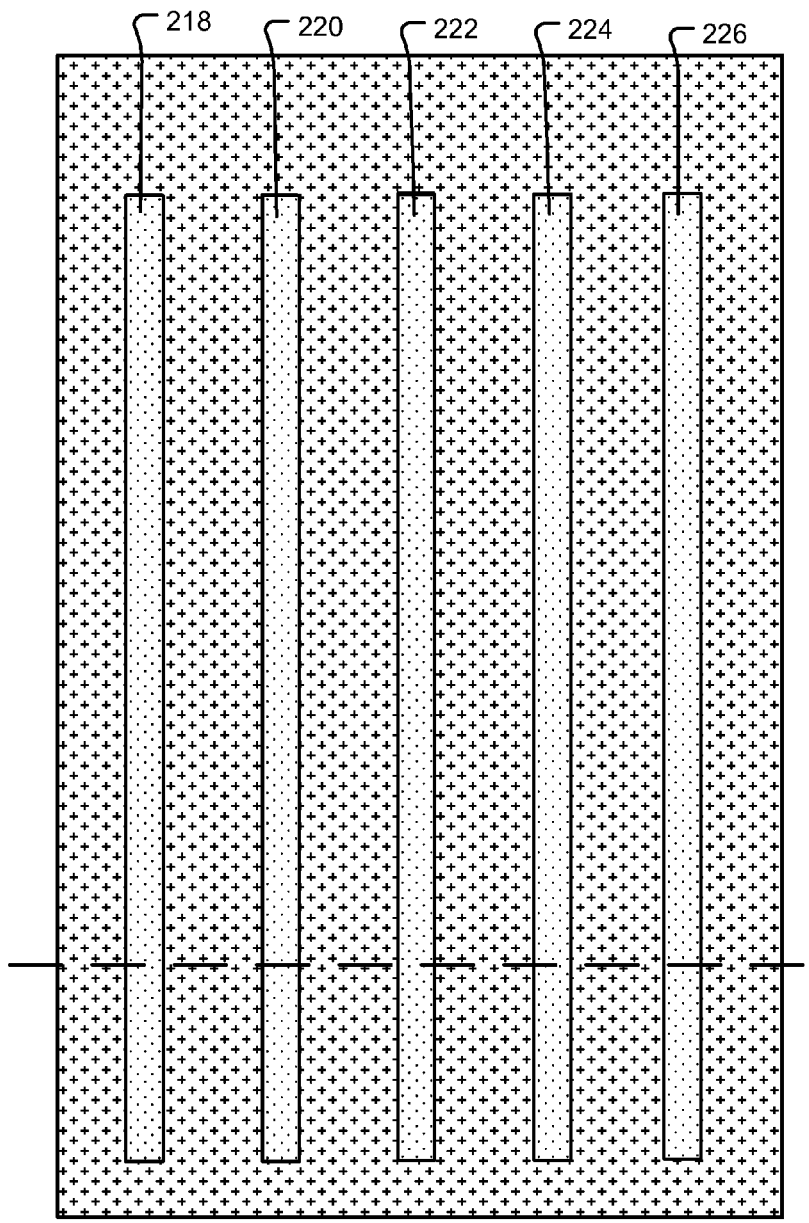
Figure 22:
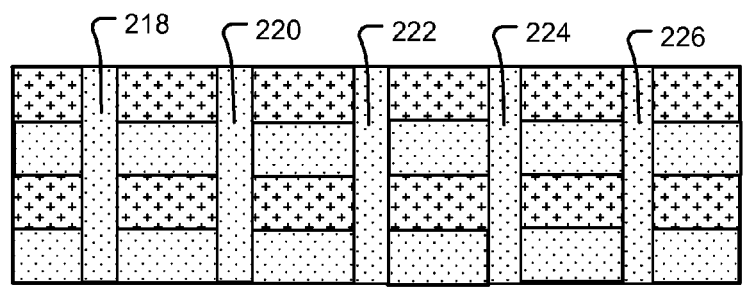

FIGS. 21 and 22 are respectively top and cross-section views of a step in the process flow of making the 3D vertical gate memory array with vertical gates at staggered intervals. In the top view of FIG. 21, the cavities etched in FIGS. 19 and 20 are filled with dielectric material such as dielectric strip columns 218, 220, 222, 224, and 226.

In one embodiment, the dielectric material is the same material as the material in the dielectric strips of the multiple strip stacks. In other embodiments, although the dielectric material is an insulating material described as suitable for the dielectric strips of the multiple strip stacks, the dielectric material formed in FIGS. 21 and 22 is different from the dielectric material in the insulating strips of the multiple strip stacks.

In FIG. 21, dielectric material fills the cavities formed in FIGS. 19 and 20. FIG. 22 shows a cross-section view taken along the dashed line in FIG. 21. In FIG. 22, dielectric strip columns 218, 220, 222, 224, and 226 have a depth dimension that runs from the top layer strips of the multiple stacks of strips, to the bottom layer strips of the multiple stacks of strips. The dielectric material in the dielectric columns electrically isolates adjacent vertical gate columns, to be formed subsequently.

Figure 23:
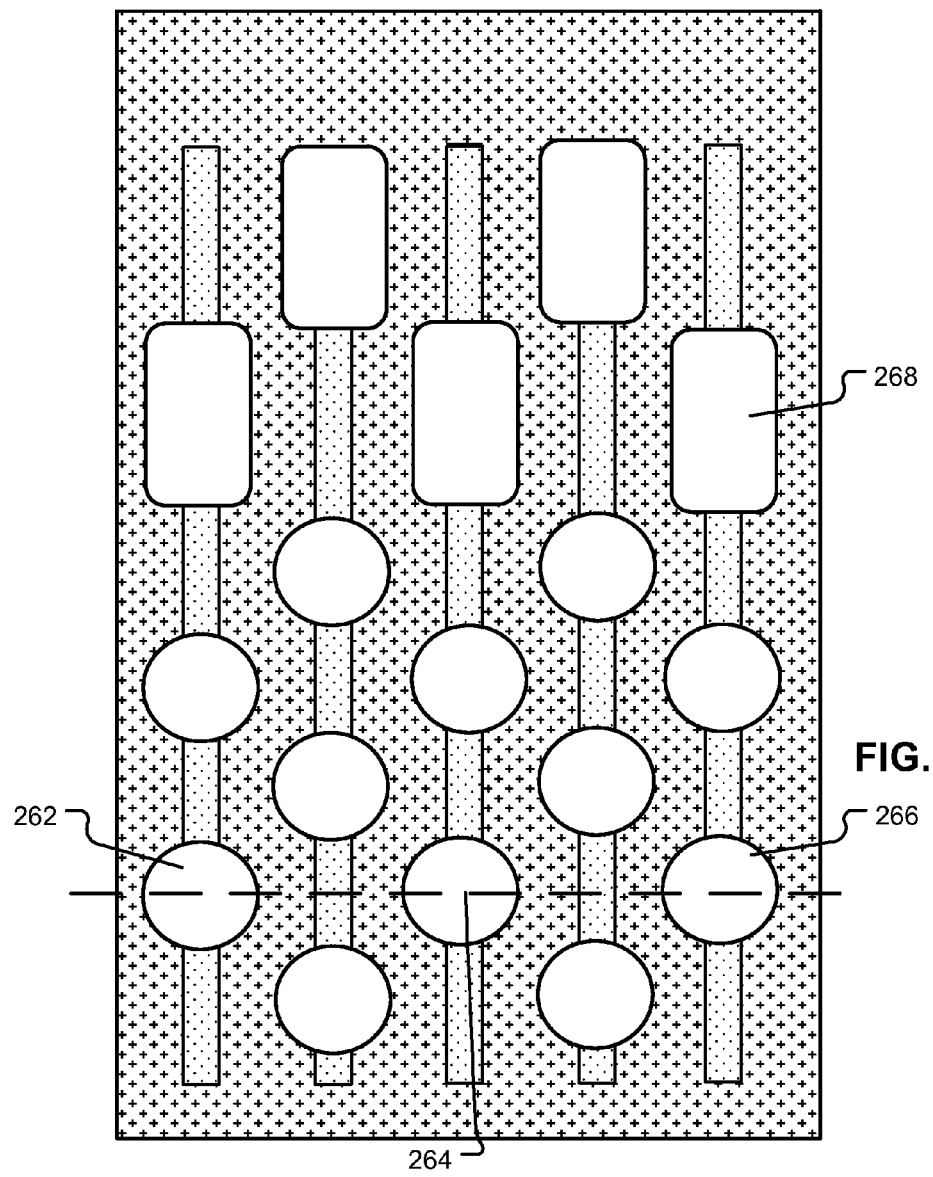
Figure 24:
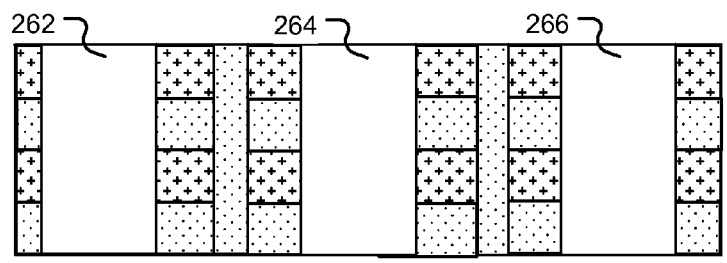

FIGS. 23 and 24 are respectively top and cross-section views of a step in the process flow of making the 3D vertical gate memory array with vertical gates at staggered intervals. In the top view of FIG. 23, the dielectric material formed in FIGS. 21 and 22 is etched away selectively into multiple dielectric columns. Strip stack material adjacent to the dielectric material is also etched away. Sufficient strip stack material adjacent to the dielectric material is etched, in order to allow for sufficient room for subsequent formation of charge storage structures and vertical gate columns. For this reason, the cavities may be, although are not required to be, larger than the cavities etched in FIGS. 13 and 14.

In FIG. 23, etched cavities such as cavities 262, 266, and 268 are centered about the dielectric material formed in FIGS. 21 and 22. Consecutively adjacent strips of dielectric material can be labeled as alternating between even dielectric material strips and odd dielectric material strips. Horizontal rows of cavities alternate between a row of cavities centered about even dielectric material strips, and a row of cavities centered about odd dielectric material strips. As a result, the cavities in neighboring rows of cavities are staggered relative to each other. The cavities in different rows of cavities centered about even dielectric material strips are aligned with each other, and the cavities in different rows of cavities centered about odd dielectric material strips are aligned with each other.

In FIG. 24, etched cavities such as cavities 262, 264, and 266 have a depth dimension that runs from the top layer strips of the multiple stacks of strips, to the bottom layer strips of the multiple stacks of strips. Cavities are formed by etching away every other dielectric material strip, and strip stack material adjacent to the dielectric material.

Figures 25, 26:
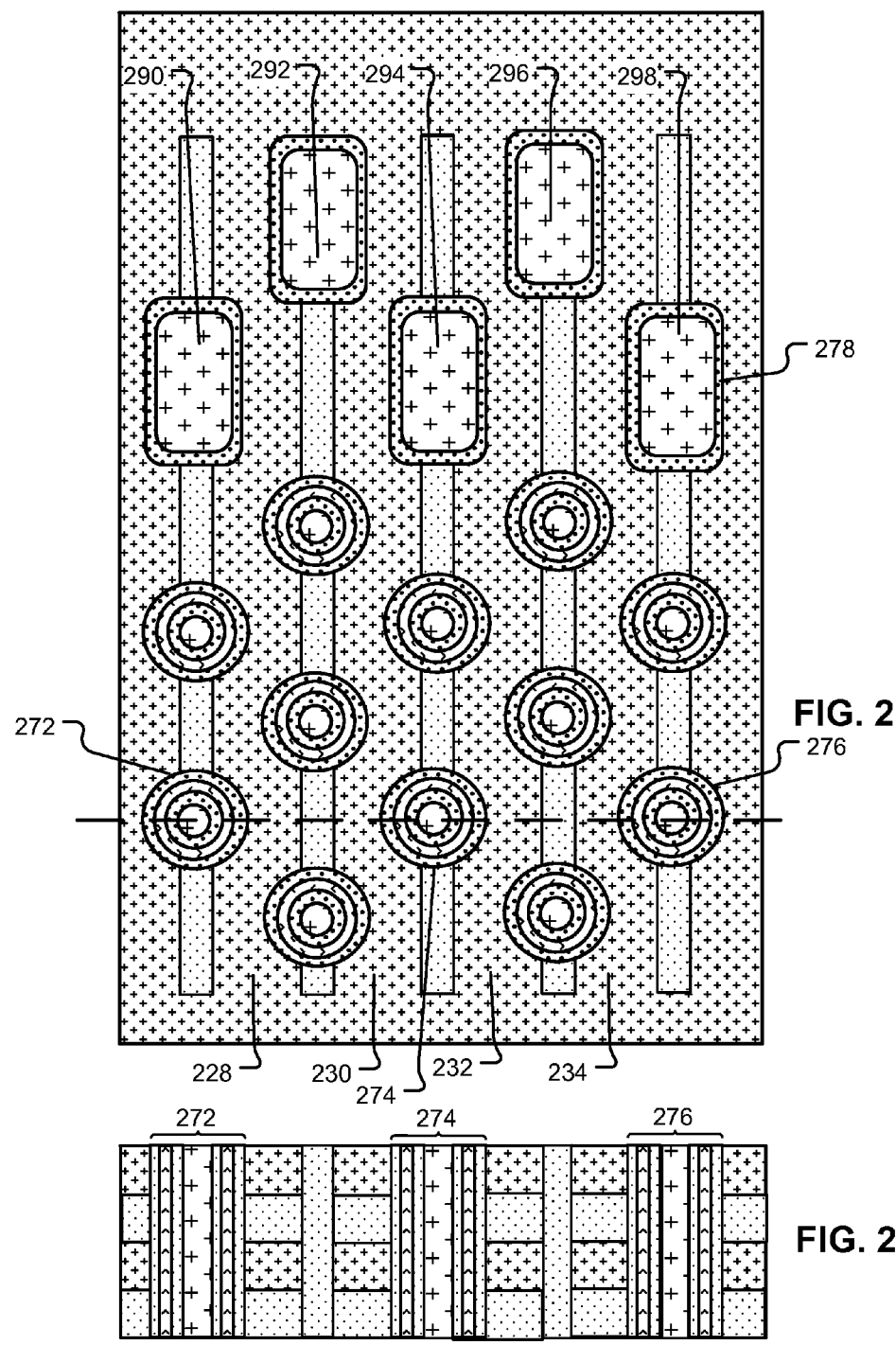

FIGS. 25 and 26 are respectively top and cross-section views of a step in the process flow of making the 3D vertical gate memory array with vertical gates at staggered intervals. In the top view of FIG. 25, the cavities etched in FIGS. 23 and 24 are filled with concentric charge storage structures and vertical gate columns as shown in FIGS. 4 and 5. Each nonvolatile memory device has a curved channel, a curved charge storage structure, and a curved gate.

FIG. 26 shows a cross-section view taken along the dashed line in FIG. 25. Because the inner vertical gate columns are formed in the high aspect ratio cavity rather than etched away from a high aspect ratio cavity, the risk of unwanted poly traces from incomplete etching is decreased. The risk of unwanted shorts from the vertical gate columns is limited to isolating the top surfaces from each other.

In FIG. 26, charge storage structures and vertical gate columns 272, 274, and 276 have a depth dimension that runs from the top layer strips of the multiple stacks of strips, to the bottom layer strips of the multiple stacks of strips. The charge storage structure adjacent to respective conductive strips in the multiple stacks of strips stores charge which alters the bias to be applied in order to cause current flow in the proximate part of the conductive strip.

In FIG. 26, the vertical gate columns 290, 292, 294, 296, and 298 are gates for string select devices. Vertical gate columns 290, 292, 294, 296, and 298 have an exterior liner of dielectric material to electrically decouple vertical gate columns 290, 292, 294, 296, and 298 from conductive strips in the adjacent strip stacks.

Figure 27:
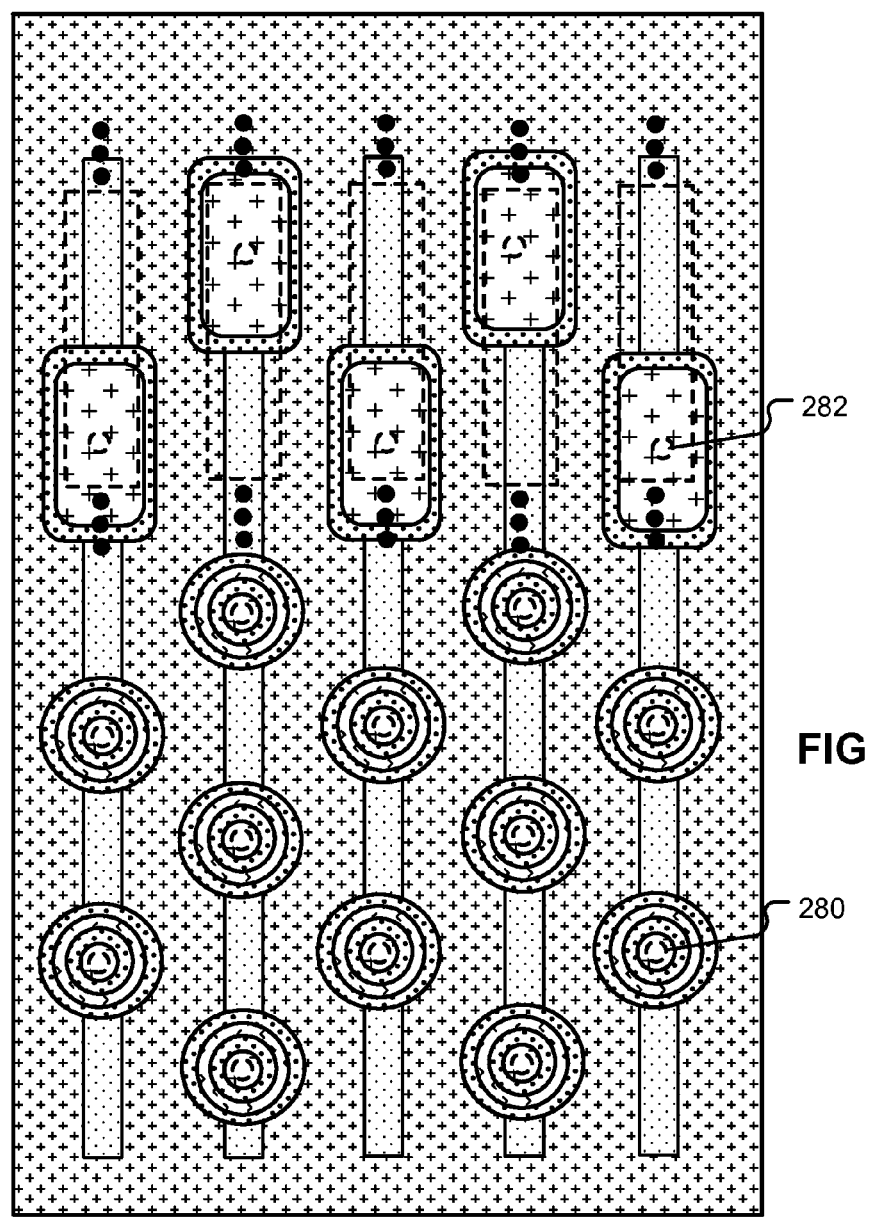

FIG. 27 is a top view of a step in the process flow of making the 3D vertical gate memory array with vertical gates at staggered intervals. In the top view of FIG. 27, conductive plugs such as conductive plugs 280 and 282 are formed to assist electrical coupling between the formed vertical gate columns and the subsequently formed word lines and string select lines.

Figure 28:
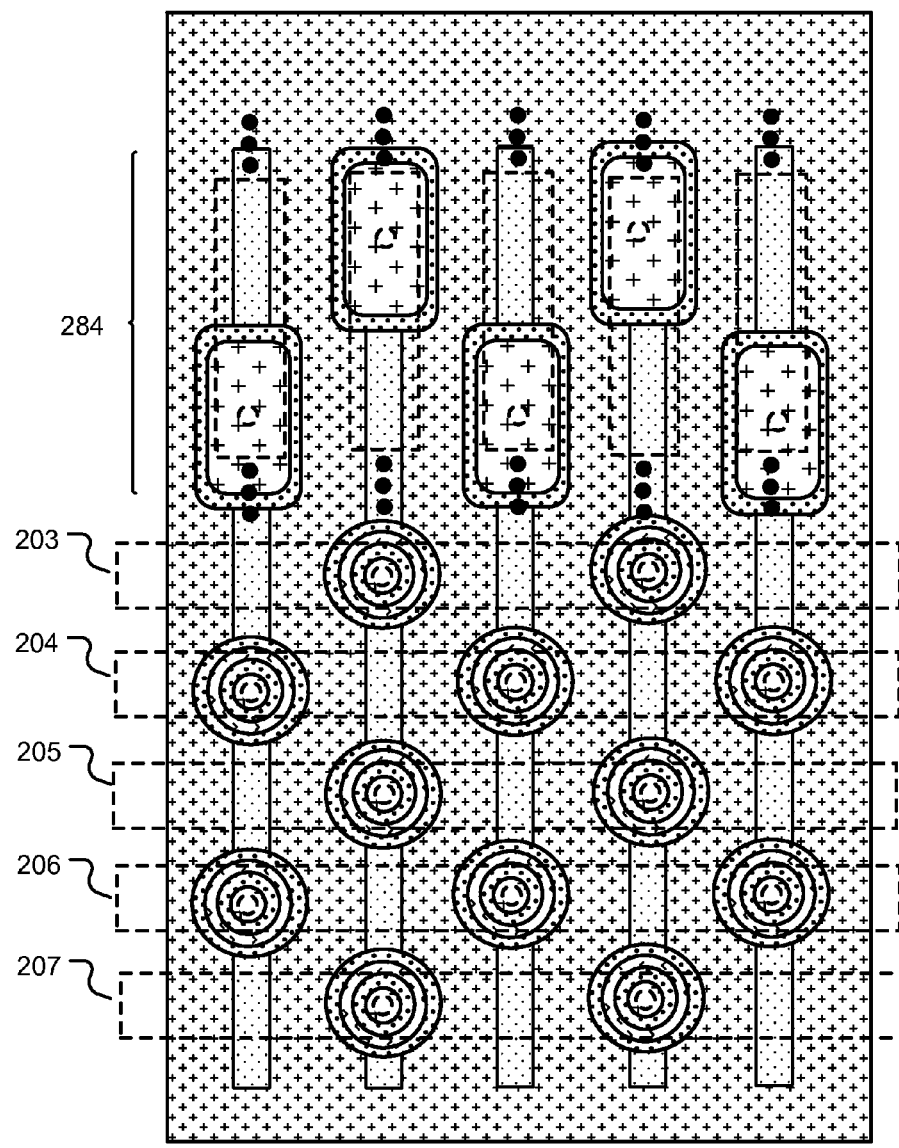

FIG. 28 is a top view of a step in the process flow of making the 3D vertical gate memory array with vertical gates at staggered intervals. In the top view of FIG. 28, word lines 203, 204, 205, 206, and 207 are formed to electrically couple to conductive plugs formed in FIG. 27, such that the word lines 203, 204, 205, 206, and 207 are electrically coupled to the vertical gate columns of nonvolatile memory cells.

String select lines 284 are formed to electrically couple to conductive plugs formed in FIG. 27, such that the string select lines 284 are electrically coupled to the vertical gate columns of string select transistors that select one or more of the multiple stacks of strips.

The string select lines 284 and the word lines 203, 204, 205, 206, and 207 are positioned at different metal levels and have perpendicular orientations. In other embodiments, the string select lines 284 and the word lines 203, 204, 205, 206, and 207 are positioned at the same metal level and/or have parallel orientations.

Figure 29:
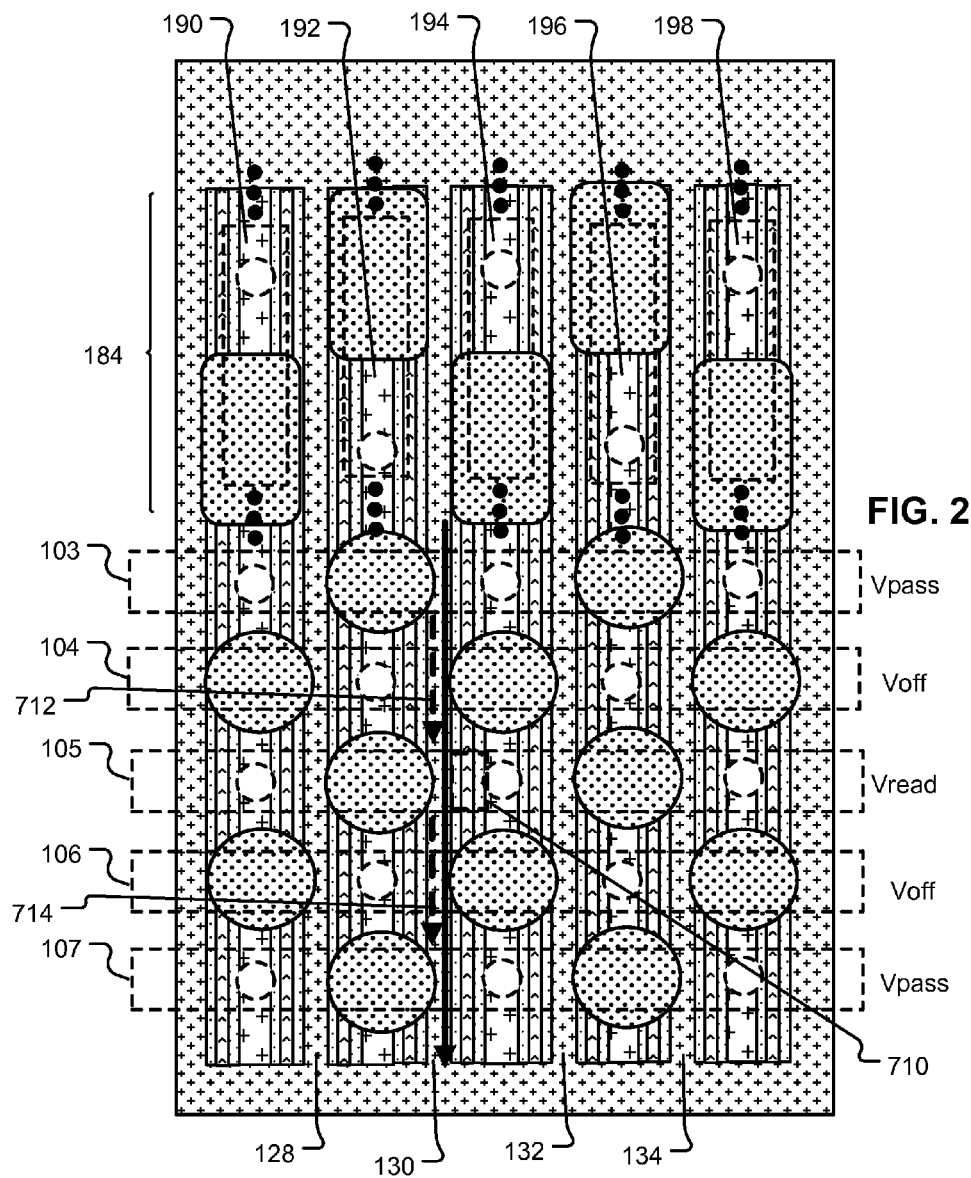
FIGS. 29-31 show bias arrangements applied to the word lines for performing memory operations on the 3D vertical gate memory array with vertical gates at staggered intervals.
Figure 30:
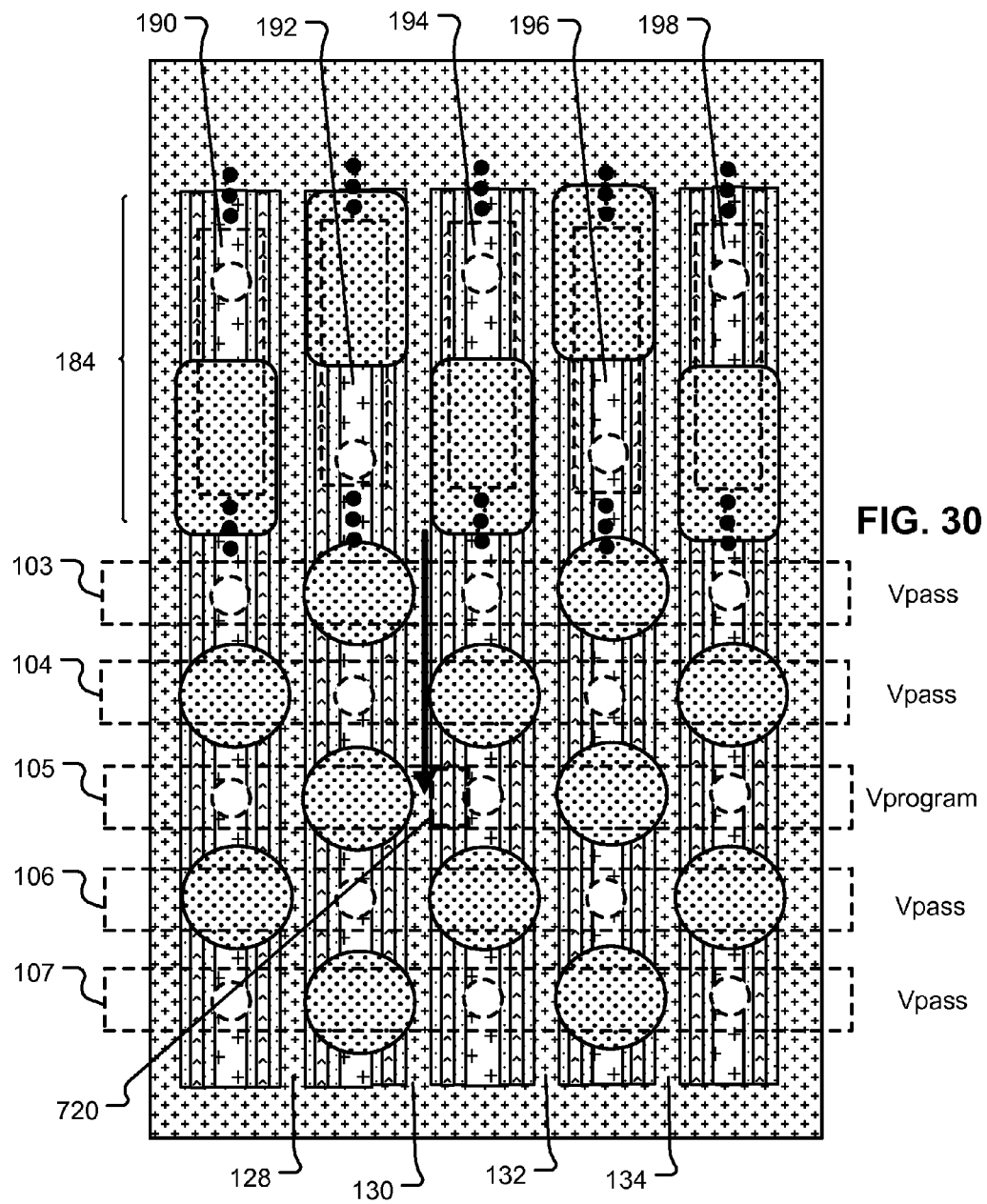
Figure 31:
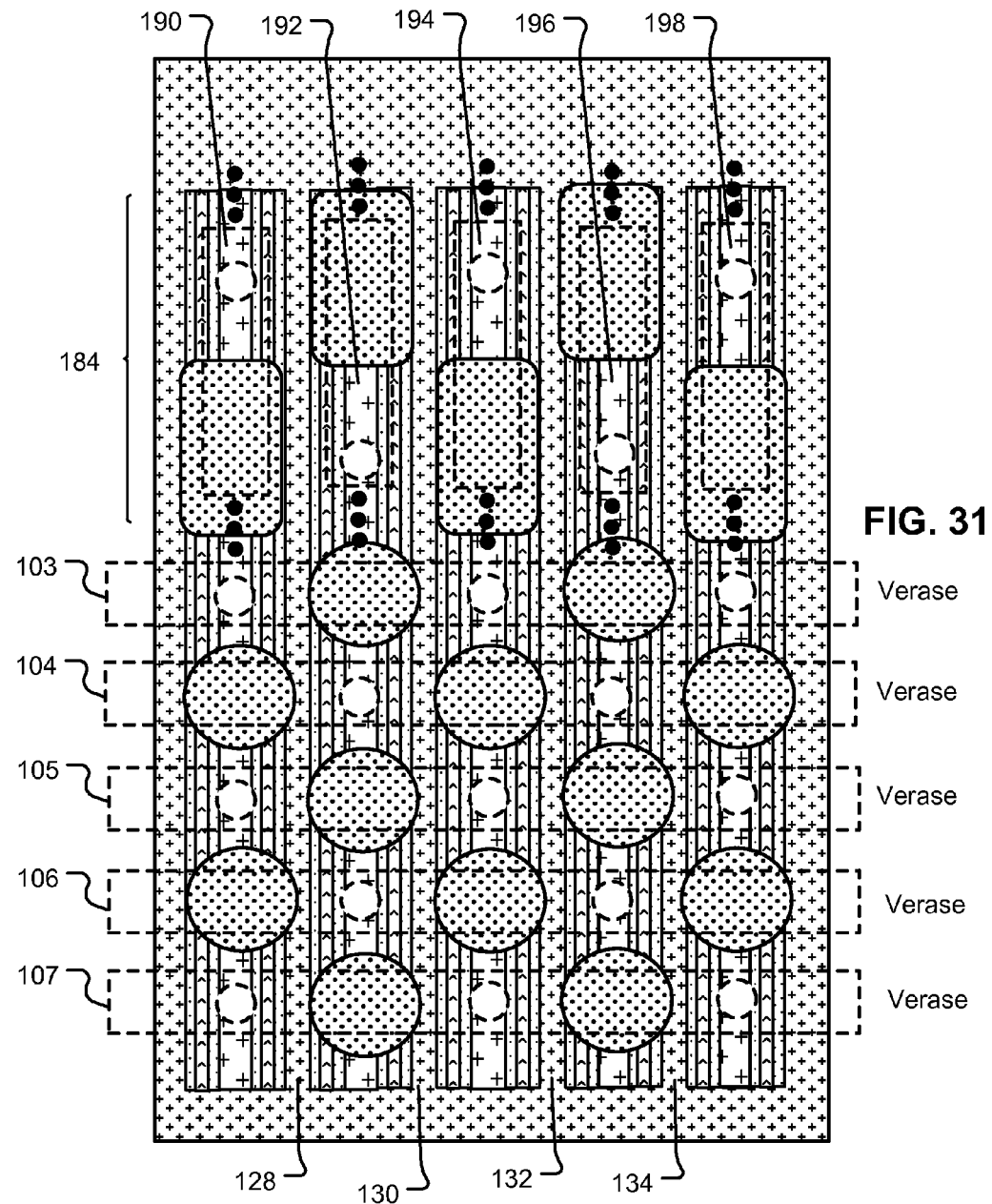

FIGS. 29-31 show bias arrangements applied to the word lines for performing memory operations on the 3D vertical gate memory array with vertical gates at staggered intervals.

In FIG. 29, word line 105 accesses the memory cell selected for a read operation. The selected memory cell includes charge storage structure 710. Word line 105 applies a read bias Vread to the vertical gates electrically coupled to word line 105. An example Vread bias is greater than 0V and less than 6V.

The string select line circuitry 184 applies string select signals to select the strip stack including the selected memory cell, and to deselect other strip stacks. String select line circuitry 184 applies string select signals via vertical gate columns 190, 192, 194, 196, and 198. To select the strip stack including top conductive strip 130, and deselect the strip stacks including top conductive strips 128, 132, and 134, the vertical gate columns 192 and 194 turn on proximate parts of the strip stack including top conductive strip 130. Remaining vertical gate columns 190, 196, and 198 do not apply an on bias.

Word lines 104 and 106 on opposite adjacent sides of word line 105 apply an off bias Voff to turn off parasitic currents 712 and 714 in the strip stack including top conductive strip 130. An example Voff bias is less than 0V. The off bias is applied by vertical gate columns electrically coupled to word lines 104 and 106, to parts of strip stacks proximate to the vertical gate columns electrically coupled to word lines 104 and 106.

Remaining word lines 103 and 107 apply a pass bias Vpass to turn on parts of strip stacks proximate to the vertical gate columns electrically coupled to word lines 103 and 107. An example Vpass bias is greater than 6V.

In combination, the biases of the read bias arrangement cause a read current to flow in the strip stack including top conductive strip 130. Layer select circuitry selects the correct conductive strip in the selected strip stack. An example of layer select circuitry is shown in FIG. 6.

In FIG. 30, word line 105 accesses the memory cell selected for a program operation. The selected memory cell includes charge storage structure 720. Word line 105 applies a program bias Vprogram to the vertical gates electrically coupled to word line 105. An example Vprogram bias is an ISPP series of pulses up to 25V.

The string select line circuitry 184 applies string select signals to select the strip stack including the selected memory cell, and to deselect other strip stacks. String select line circuitry 184 applies string select signals via vertical gate columns 190, 192, 194, 196, and 198. To select the strip stack including top conductive strip 130, and deselect the strip stacks including top conductive strips 128, 132, and 134, the vertical gate columns 192 and 194 turn on proximate parts of the strip stack including top conductive strip 130. Remaining vertical gate columns 190, 196, and 198 do not apply an on bias. The conductive strips, or bit lines, in the selected strip stack are biased at 0V, for example. The conductive strips, or bit lines, in the unselected strip stacks are biased at Vcc, for example.

Word lines 103, 104, 106, and 107 apply a pass bias Vpass to turn on parts of strip stacks proximate to the vertical gate columns electrically coupled to word lines 103, 104, 106, and 107. An example Vpass bias is over 9V for a self-boosting program inhibit effect.

In combination, the biases of the program bias arrangement cause a program current to flow in the strip stack including top conductive strip 130, and cause charge movement into the charge storage structure 720 of the selected memory cell. Layer select circuitry selects the correct conductive strip in the selected strip stack.

In FIG. 31, word lines 103-107 access all of the memory cells in a memory block for an erase operation. Word lines 103-107 apply an erase bias Verase to the vertical gates electrically coupled to word lines 103-107. An example Verase bias is −9V.

The string select line circuitry 184 applies string select signals to select all strip stacks. String select line circuitry 184 applies string select signals via vertical gate columns 190, 192, 194, 196, and 198. To select all strip stacks, the vertical gate columns 190, 192, 194, 196, and 198 turn on proximate parts of the strip stacks. The conductive strips, or bit lines, in the strip stacks are biased at 11V, for example, along with the common source line at the bottom of the array electrically coupled to all conductive strips in all strip stacks.

In alternative bias arrangement, an example Vpass bias is 0V; and the conductive strips, or bit lines, in the strip stacks and the common source line are biased at 20V. In either case, the voltage difference between the word lines and the strip stacks is −20V.

In combination, the biases of the program bias arrangement cause an erase current to flow in all strip stacks, and remove or cancel net charge previously programmed into the charge storage structure of the memory cells in the memory block. Layer select circuitry selects all conductive strips in all strip stacks.

Other examples of erase operations are disclosed in U.S. Provisional Application No. 62/036,203 filed on 12 Aug. 2014, incorporated by reference herein.

Bias arrangements similar to FIGS. 29-31 can be applied to the 3D vertical gate memory array of FIG. 3.

In such embodiments, gate injection is favored over channel injection due to the higher electric field from the higher curvature of the gate compared to the channel. One embodiment uses −FN electron programming and +FN hole erase for p-channel NAND devices. However, channel injection and/or n-channel devices are also possible.

Figure 32:
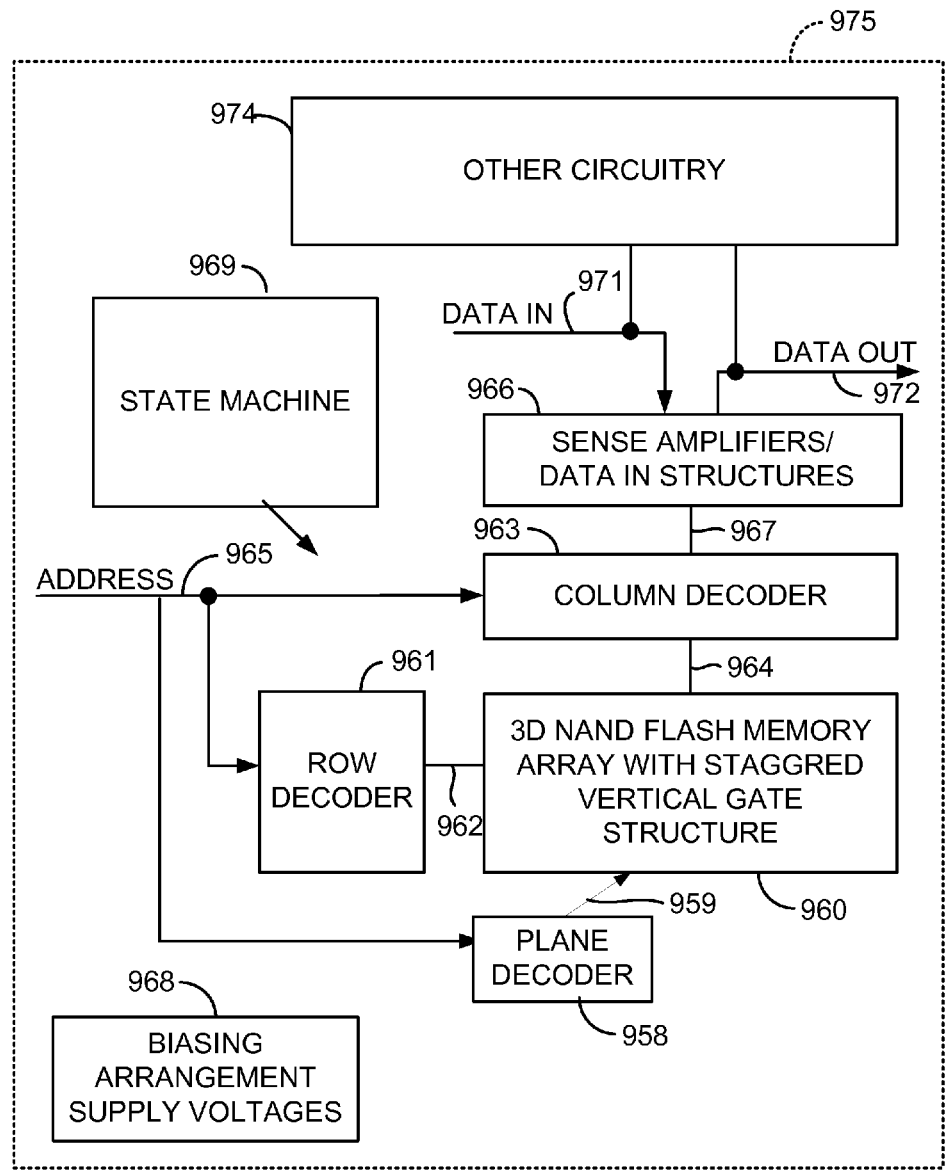
FIG. 32 is a simplified block diagram of an integrated circuit memory having a 3D vertical gate memory array with vertical gates at staggered intervals.

FIG. 32 is a simplified block diagram of an integrated circuit memory having a 3D vertical gate memory array with vertical gates at staggered intervals.

The integrated circuit line 975 includes a 3D NAND flash memory array 960, implemented as described herein with a staggered vertical gate structure, on a semiconductor substrate. A row decoder 961 is coupled to a plurality of word lines 962, and arranged along rows in the memory array 960. A column decoder 963 is coupled to a plurality of bit lines 964 (or SSL lines as described above) arranged along columns in the memory array 960 for reading and programming data from the memory cells in the array 960. A plane decoder 958 is coupled to a plurality of planes in the memory array 960 via SSL lines 959 (or bit lines as described above). Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller. The bias arrangement state machine 969 is configured to perform memory operations including erase, program, and read, such as a read operation by applying a read bias to a selected one of the plurality of word lines, and applying an off bias to two word lines of the plurality of word lines adjacent to the selected one of the plurality of word lines on opposite sides of the selected one of the plurality of word lines.

The memory array 960 can comprise charge trapping memory cells configured to store multiple bits per cell, by the establishment of multiple program levels that correspond to amounts of charge stored, which in turn establish memory cell threshold voltages $V_T$.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a plurality of stacks of conductive strips having a depth direction along which adjacent conductive strips in a same stack are separated by dielectric material;
a plurality of word lines over and orthogonal to the plurality of stacks of conductive strips, the plurality of word lines electrically coupled to a plurality of vertical gate columns acting as gates controlling current flow in the plurality of stacks of conductive strips, the plurality of word lines including a first word line and a second word line adjacent to each other; and
the plurality of vertical gate columns between the plurality of stacks of conductive strips, the plurality of vertical gate columns including a first set of vertical gate columns electrically coupled to the first word line and a second set of vertical gate columns electrically coupled to the second word line, the first set of vertical gate columns staggered relative to the second set of vertical gate columns,
wherein at a first position along the plurality of word lines, the first word line overlies a first dielectric region and overlies none of the first set of vertical gate columns, and the second word line overlies one of the second set of vertical gate columns, and
wherein at a second position along the plurality of word lines, the first word line overlies one of the first set of vertical gate columns, and the second word line overlies a second dielectric region and overlies none of the second set of vertical gate columns,
wherein the first dielectric region and the second dielectric region have thicknesses in the depth direction that exceed a combined thickness in the depth direction of at least two of the conductive strips in the same stack; and
control circuitry controlling the plurality of word lines as gates to control current flow in the plurality of stacks of conductive strips, and controlling nonvolatile memory operations.

2. The memory device of claim 1, wherein the plurality of vertical gate columns has a first pitch greater than a second pitch of the plurality of word lines.

3. The memory device of claim 1, wherein the first set of vertical gate columns is staggered relative to the second set of vertical gate columns, such that the first set of vertical gate columns is separated by a first set of gate column gaps along the first word line, the second set of vertical gate columns is separated by a second set of gate column gaps along the second word line, the first set of vertical gate columns adjacent to the second set of gate column gaps, the second set of vertical gate columns adjacent to the first set of gate column gaps.

4. The memory device of claim 1, wherein the plurality of vertical gate columns have curved exterior surfaces.

5. The memory device of claim 1, further comprising a plurality of curved charge storage layers surrounding the plurality of vertical gate columns.

6. The memory device of claim 5, wherein adjacent stacks of the plurality of stacks are separated by a volume having a length, and the volume alternates along the length between (i) dielectric fill and (ii) one of the plurality of vertical gate columns surrounded by one of the plurality of curved charge storage layers.

7. The memory device of claim 1, further comprising a plurality of flat charge storage layers on opposite sides of the plurality of vertical gate columns.

8. The memory device of claim 7, wherein adjacent stacks of the plurality of stacks are separated by a volume having a length, and the volume alternates along the length between (i) dielectric fill and (ii) one of the plurality of vertical gate columns having flat charge storage layers on opposite sides of the plurality of vertical gate columns.

9. The memory device of claim 1, wherein the control circuitry performs a read operation by applying a read bias to a selected one of the plurality of word lines, and applying an off bias to another word line of the plurality of word lines adjacent to the selected one of the plurality of word lines.

10. The memory device of claim 1, wherein the control circuitry performs a read operation by applying a read bias to a selected one of the plurality of word lines, and applying an off bias to two word lines of the plurality of word lines adjacent to the selected one of the plurality of word lines on opposite sides of the selected one of the plurality of word lines.

11. A method, comprising:
  forming a plurality of stacks of conductive strips having a depth dimension along which adjacent conductive strips in a same stack are separated by dielectric material, the plurality of stacks separated by a plurality of gaps;
  forming a plurality of word lines over and orthogonal to the plurality of stacks of conductive strips, the plurality of word lines electrically coupled to a plurality of vertical gate columns acting as gates controlling current flow in the plurality of stacks of conductive strips, the plurality of word lines including a first word line and a second word line adjacent to each other;
  forming the plurality of vertical gate columns between the plurality of stacks of conductive strips, the plurality of vertical gate columns including a first set of vertical gate columns electrically coupled to the first word line and a second set of vertical gate columns electrically coupled to the second word line, the first set of vertical gate columns staggered relative to the second set of vertical gate columns,
    wherein at a first position along the plurality of word lines, the first word line overlies a first dielectric region and overlies none of the first set of vertical gate columns, and the second word line overlies one of the second set of vertical gate columns, and
    wherein at a second position along the plurality of word lines, the first word line overlies one of the first set of vertical gate columns, and the second word line overlies a second dielectric region and overlies none of the second set of vertical gate columns,
    wherein the first dielectric region and the second dielectric region have thicknesses in the depth direction that exceed a combined thickness in the depth direction of at least two of the conductive strips in the same stack; and
  forming control circuitry controlling the plurality of word lines as gates to control current flow in the plurality of stacks of conductive strips and to control nonvolatile memory operations.

12. The method of claim 11, wherein the plurality of vertical gate columns has a first pitch greater than a second pitch of the plurality of word lines.

13. The method of claim 11, further comprising:
  forming charge storage layers and gate material in the plurality of gaps;
  etching the gate material to leave the plurality of vertical gate columns separated by a plurality of holes; and
  forming dielectric in the plurality of holes.

14. The method of claim 11, further comprising:
  forming dielectric in the plurality of gaps;
  etching the dielectric and pluralities of stacks of conductive strips to form cavities centered in the dielectric in between the stacks of conductive strips;
  forming the plurality of vertical gate columns in the cavities.

15. The method of claim 11, wherein the first set of vertical gate columns is staggered relative to the second set of vertical gate columns, such that the first set of vertical gate columns is separated by a first set of gate column gaps along the first word line, the second set of vertical gate columns is separated by a second set of gate column gaps along the second word line, the first set of vertical gate columns adjacent to the second set of gate column gaps, the second set of vertical gate columns adjacent to the first set of gate column gaps.

16. The method of claim 11, wherein the plurality of vertical gate columns have curved exterior surfaces.

17. The method of claim 11, further comprising a plurality of curved charge storage layers surrounding the plurality of vertical gate columns.

18. The method of claim 17, wherein adjacent stacks of the plurality of stacks are separated by a volume having a length, and the volume alternates along the length between (i) dielectric fill and (ii) one of the plurality of vertical gate columns surrounded by one of the plurality of curved charge storage layers.

19. The method of claim 11, further comprising a plurality of flat charge storage layers on opposite sides of the plurality of vertical gate columns.

20. The method of claim 19, wherein adjacent stacks of the plurality of stacks are separated by a volume having a length, and the volume alternates along the length between (i) dielectric fill and (ii) one of the plurality of vertical gate columns having flat charge storage layers on opposite sides of the plurality of vertical gate columns.

21. The memory device of claim 11, wherein the control circuitry performs a read operation by applying a read bias to a selected one of the plurality of word lines, and applying an off bias to another word line of the plurality of word lines adjacent to the selected one of the plurality of word lines.

22. The memory device of claim 11, wherein the control circuitry performs a read operation by applying a read bias to a selected one of the plurality of word lines, and applying an off bias to two word lines of the plurality of word lines adjacent to the selected one of the plurality of word lines on opposite sides of the selected one of the plurality of word lines.

* * * * *